US012579345B2

(12) United States Patent
Chandrasekhar et al.

(10) Patent No.: US 12,579,345 B2
(45) Date of Patent: Mar. 17, 2026

(54) OPTIMIZATION OF A DESIGN USING A PHYSICS SOLVER INTEGRATED WITH A NEURAL NETWORK

(71) Applicant: Genesee Valley Innovations, LLC, Santa Clara, CA (US)

(72) Inventors: Aaditya Chandrasekhar, Madison, WI (US); Amirmassoud Mirzendehdel, San Mateo, CA (US); Morad Behandish, San Mateo, CA (US)

(73) Assignee: Genesee Valley Innovations, LLC, Santa Clara, CA (US)

( * ) Notice: Subject to any disclaimer, the term of this patent is extended or adjusted under 35 U.S.C. 154(b) by 938 days.

(21) Appl. No.: 17/714,849

(22) Filed: Apr. 6, 2022

(65) Prior Publication Data

US 2023/0325561 A1     Oct. 12, 2023

(51) Int. Cl.
*G06F 30/27* (2020.01)
*G06F 30/23* (2020.01)

(52) U.S. Cl.
CPC .............. *G06F 30/27* (2020.01); *G06F 30/23* (2020.01)

(58) Field of Classification Search
CPC ...... G06F 30/27; G06F 30/23; G06F 2111/06; G06F 2113/10; G06F 2113/26; G06F 30/25; G06F 30/367; G06F 30/398; G06N 3/048; G06N 3/084; G06N 3/10; B33Y 50/00; G16C 20/70; G16C 20/90
See application file for complete search history.

(56) References Cited

PUBLICATIONS

Pidaparti, R. M. V., and M. J. Palakal. "Material model for composites using neural networks." AIAA journal 31.8 (1993): 1533-1535 (Year: 1993).*
El Kadi, Hany. "Modeling the mechanical behavior of fiber-reinforced polymeric composite materials using artificial neural networks—A review." Composite structures 73.1 (2006): 1-23 (Year: 2006).*
White, Daniel A., et al. "Multiscale topology optimization using neural network surrogate models." Computer Methods in Applied Mechanics and Engineering 346 (2019): 1118-1135 (Year: 2019).*
Bendsoe, et al., "Topology optimization: theory, methods, and applications," 2nd Edition, Springer Berlin Heidelberg, 2003.
(Continued)

*Primary Examiner* — Saif A Alhija
(74) *Attorney, Agent, or Firm* — Mueting Raasch Group

(57) ABSTRACT

A computer-implemented physics solver operates within a neural network framework. A neural network accepts a coordinate for each location within a design domain and outputs a local composition for each location. A model of the design domain is formed in a physics solver. The model includes discrete elements that encompass the design domain. A solution of the model provides a value of a design objective. For a plurality of iterations, the following is performed: the neural network determines current local compositions for the locations in the design domain corresponding to the discrete elements; the current local compositions are input into the discrete elements of the physics solver to obtain a current value of the design objective; and the current value of the design objective is used to find a loss gradient of a loss function. The loss gradient is used to update the neural network during the iterations.

20 Claims, 17 Drawing Sheets

(56) References Cited

PUBLICATIONS

Chandrasekhar et al., "AuTO: A Framework for Automatic differentiation in Topology Optimization," arXiv:2104.01965; Apr. 5, 2021; 12 pgs.

Hoyer, et al., "Neural reparameterization improves structural optimization," arXiv preprint arXiv:1909.04240, Sep. 14, 2019: 6 pgs.

Li, et al., "Full-scale topology optimization for fiber-reinforced structures with continuous fiber paths," Computer Methods in Applied Mechanics and Engineering, Jan. 2021 377: 113668: 32 pgs.

Rahaman et al., "On the spectral bias of neural networks," in: 36th International Conference on Machine Learning, ICML 2019, vol. 2019—Jun. 2019, pp. 9230-9239.

Sivapuram et al., "Simultaneous material and structural optimization by multiscale topology optimization," Structural and Multidisciplinary Optimization, Nov. 1, 2016; 54(5): 1267-1281.

Sosnovik, I. Oseledets, "Neural networks for topology optimization," Russian Journal of Numerical Analysis and Mathematical Modelling, 2019;34(4): 215-223.

Tancik et al., "Fourier features let networks learn high frequency functions in low dimensional domains," arXiv preprint arXiv; 2006.10739; Jun. 18, 2020: 24 pgs.

Zhang et al., Speeding up computational morphogenesis with online neural synthetic gradients, in: 2021 International Joint Conference on Neural Networks (IJCNN), IEEE, Apr. 25, 2021, pp. 1-8.

Chadrasekhar et al., "Build optimization of fiber-reinforces additively manufacture components," Jul. 2019, *Structural and Multidisciplinary Optimization*, 61(1): 77-90.

Chadrasekhar et al., "FRC-TOuNN: Topology Optimization of Continuous Fiber Reinforced Composites Using Neural Network," May 7, 2022, Cornell University Library, Ithaca NY, 25 pages.

Chadrasekhar et al., "Length Scale Control in Topology Optimization Using Fourier Enhanced Neural Networks," Sep. 7, 2021, Cornell University Library, Ithaca NY, 21 pages.

Chadrasekhar et al., "Multi-Material Topology Optimization Using Neural Networks," Mar. 3, 2021, *Computer-Aided Design*, 136: 14 pages.

Chadrasekhar et al., "TOuNN: Topology Optimization using Neural Networks," Mar. 1, 2021, *Structural and Multidisciplinary Optimization*, 63(3): 1135-49.

European Patent Application No. 23162701.9, Extended European Search Report issued Aug. 3, 2023.

Kim et al., "Machine learning-combined topology optimization for functionary graded composite structure design," Sep. 20, 2021, *Computer Methods in Applied Mechanics and Engineering*, 387: 32 pages.

* cited by examiner $$\psi_1^{[2]} \approx \frac{e^{z_1^{[2]}}}{e^{z_1^{[2]}} + e^{z_2^{[2]}}}$$

Figure 5:
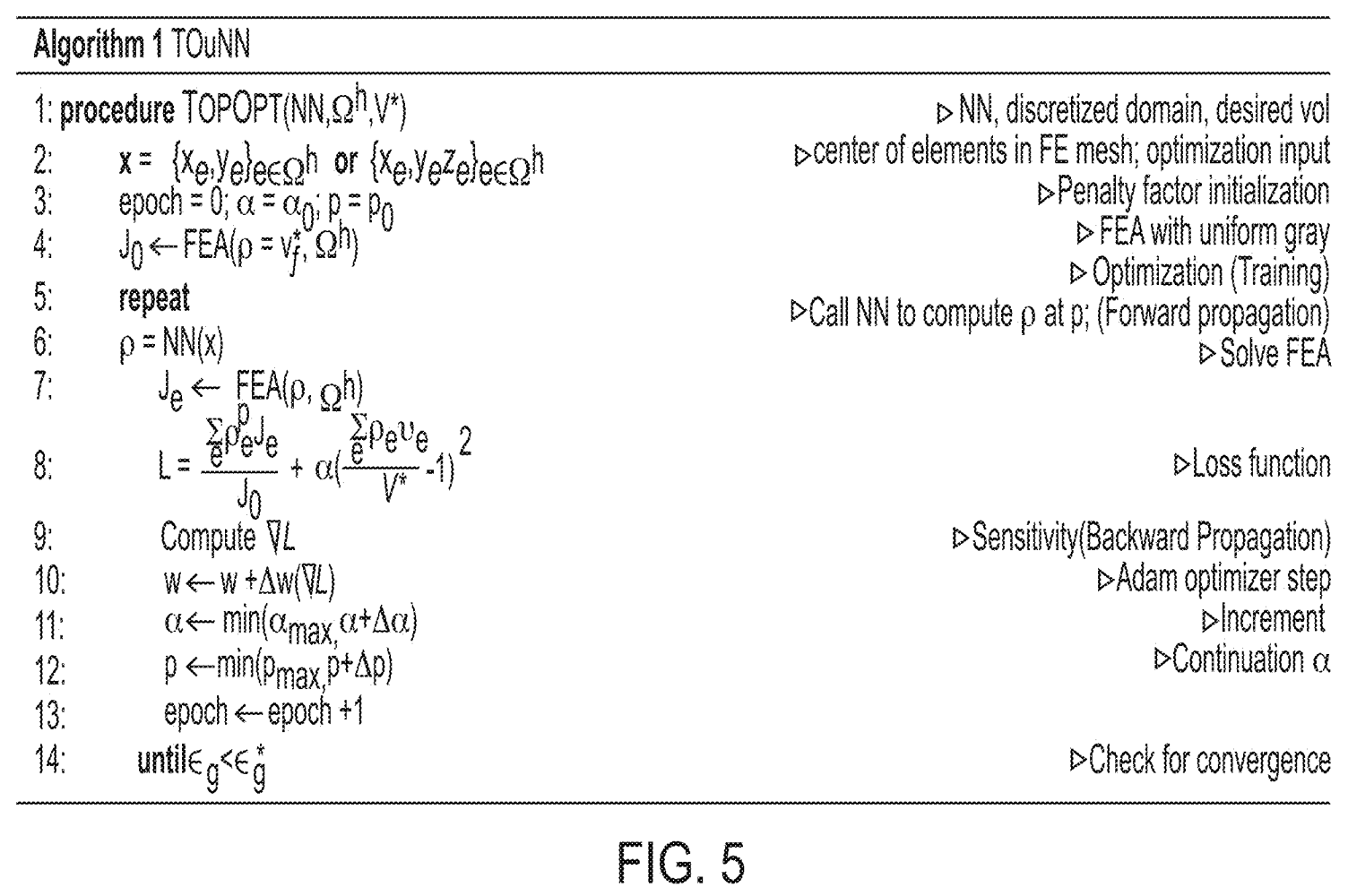

Algorithm 1 TOuNN

1: procedure TOPOPT(NN,$\Omega^h$,$v^*$)      ▷ NN, discretized domain, desired vol 2:    $x = \{x_e, y_e\}_{e \in \Omega^h}$ or $\{x_e, y_e, z_e\}_{e \in \Omega^h}$      ▷ center of elements in FE mesh; optimization input 3:    epoch = 0; $\alpha = \alpha_0$; $p = p_0$      ▷ Penalty factor initialization 4:    $J_0 \leftarrow FEA(\rho = v_f^*, \Omega^h)$      ▷ FEA with uniform gray 5:    repeat      ▷ Optimization (Training)

6:    $\rho = NN(x)$      ▷ Call NN to compute $\rho$ at p; (Forward propagation)

7:    $J_e \leftarrow FEA(\rho, \Omega^h)$      ▷ Solve FEA

8:    $L = \dfrac{\sum_e \rho_e^p J_e}{J_0} + \alpha \left( \dfrac{\sum_e \rho_e v_e}{V^*} - 1 \right)^2$      ▷ Loss function 9:    Compute $\nabla L$      ▷ Sensitivity(Backward Propagation)

10:    $w \leftarrow w + \Delta w(\nabla L)$      ▷ Adam optimizer step

11:    $\alpha \leftarrow \min(\alpha_{max}, \alpha + \Delta \alpha)$      ▷ Increment 12:    $p \leftarrow \min(p_{max}, p + \Delta p)$      ▷ Continuation $\alpha$ 13:    epoch ← epoch +1

14:    until $|\epsilon_g < \epsilon_g^*|$      ▷ Check for convergence

Figure 8:
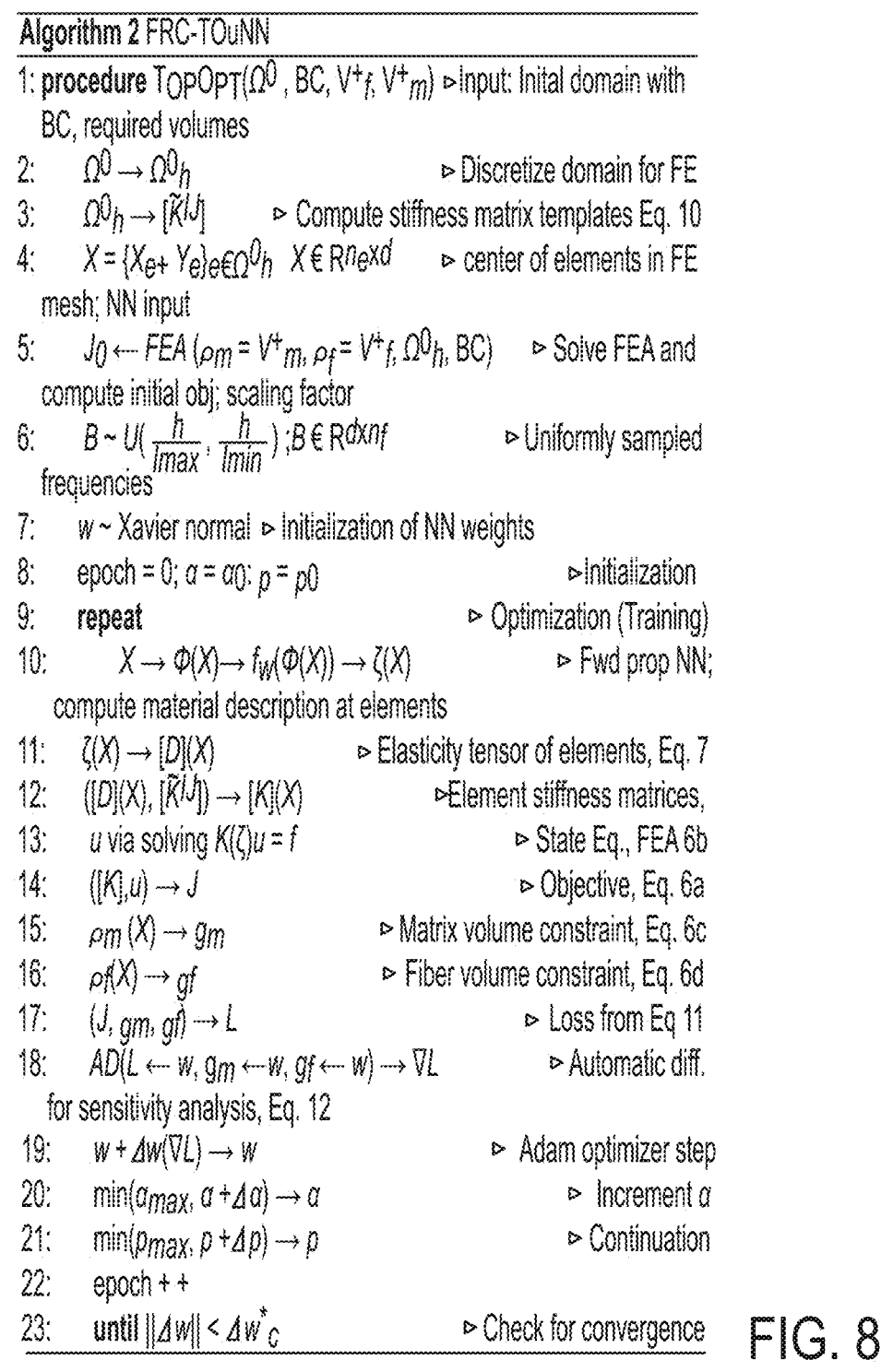

Algorithm 2 FRC-TOuNN

---

1: procedure $\text{TopOpt}(\Omega^0, BC, V^+_f, V^+_m)$ ▷ Input: Inital domain with BC, required volumes 2:     $\Omega^0 \to \Omega^0_h$                ▷ Discretize domain for FE 3:     $\Omega^0_h \to [\tilde{K}^{IJ}]$      ▷ Compute stiffness matrix templates Eq. 10

4:     $X = \{X_e + Y_e\}_{e \in \Omega^0_h}$   $X \in R^{n_e \times d}$    ▷ center of elements in FE mesh; NN input 5:     $J_0 \leftarrow FEA\,(\rho_m = V^+_m, \rho_f = V^+_f, \Omega^0_h, BC)$    ▷ Solve FEA and compute initial obj; scaling factor 6:     $B \sim U(\frac{h}{l_{max}}, \frac{h}{l_{min}})$ ; $B \in R^{d \times n_f}$       ▷ Uniformly sampled frequencies 7:     $w \sim$ Xavier normal ▷ Initialization of NN weights 8:     epoch = 0; $\alpha = \alpha_0$; $p = p0$            ▷Initialization 9:     repeat             ▷ Optimization (Training)

10:     $X \to \Phi(X) \to f_w(\Phi(X)) \to \zeta(X)$      ▷ Fwd prop NN; compute material description at elements 11:     $\zeta(X) \to [D](X)$      ▷ Elasticity tensor of elements, Eq. 7

12:     $([D](X), [\tilde{K}^{IJ}]) \to [K](X)$      ▷Element stiffness matrices, 13:     $u$ via solving $K(\zeta)u = f$      ▷ State Eq., FEA 6b 14:     $([K], u) \to J$      ▷ Objective, Eq. 6a 15:     $\rho_m(X) \to g_m$      ▷ Matrix volume constraint, Eq. 6c 16:     $\rho_f(X) \to g_f$      ▷ Fiber volume constraint, Eq. 6d 17:     $(J, g_m, g_f) \to L$      ▷ Loss from Eq 11

18:     $AD(L \leftarrow w, g_m \leftarrow w, g_f \leftarrow w) \to \nabla L$      ▷ Automatic diff. for sensitivity analysis, Eq. 12

19:     $w + \Delta w(\nabla L) \to w$      ▷ Adam optimizer step

20:     $\min(\alpha_{max}, \alpha + \Delta \alpha) \to \alpha$      ▷ Increment $\alpha$ 21:     $\min(p_{max}, p + \Delta p) \to p$      ▷ Continuation 22:     epoch + +

23:     until $\|\Delta w\| < \Delta w^*_c$      ▷ Check for convergence

| Parameter | Description and default value |
|---|---|
| $E_m, v_m$ | Isotropic matrix Young's Modulus $E_m = 1 GPa$, Poisson's ratio $v = 0.3$ |
| $E^{\parallel}_f, E^{\perp}_f, v_f, G_f$ | Orthotropic fiber inclusion material constants. $E^{\parallel}_f = 4 GPa, E^{\perp}_f = 2 GPa, v_f = 0.3, G_f = 0.7 GPa$ |
| $n_f$ | Number of frequencies in projection space = 150 |
| $l_{min}, l_{max}$ | $l_{min} = 4$ and $l_{max} = 80$ to allow wide range of length scales. |
| NN | Fully connected feed-forward network with one common layer, and one layer at each of the forks activated by Swish function with 20 Neurons in each layer. |
| $a_{max}, \Delta a$ | Penalty method constraint with ($a_{max} = 100$, $\Delta a = a_0 = 0.05$) |
| $p$ | SIMP penalty updated every iteration ($p_0 = 1$ ; $\Delta p = 0.02$ ; $p_{max} = 8$) |
| lr | Adam Optimizer learning rate 0.01 |
| nelx, nely | Number of FEA mesh elements of (60, 30) along $x$ and $y$ respectively |
| lx, ly | Size of domain along $x = 60\ m$ and $y = 30\ m$ |
| $\epsilon^*_g$ | Convergence criteria requiring change in norm of the weights be less than $\Delta w^*_c = 0.005$ |

FIG. 9

OPTIMIZATION OF A DESIGN USING A PHYSICS SOLVER INTEGRATED WITH A NEURAL NETWORK

SUMMARY

Embodiments described herein include a manufacturing system that optimizes geometry in view of additive support structures. In one embodiment, a design domain for a structure is defined. The structure is formed of a composite material comprising anisotropic elements embedded in a matrix material. The design domain includes inputs to the structure and constraints on the structure. A neural network is used that accepts a coordinate for each location within the design domain and outputs a local composition for each location. The local composition includes: a density of the matrix material; an orientation of the anisotropic elements; and a concentration of the anisotropic elements. A model of the design domain is formed in a physics solver. The model includes a plurality of discrete elements that encompass the design domain. A solution of the model provides a value of a design objective. For each iteration of a plurality of iterations, the following is performed: determining, from the neural network, current local compositions for the locations in the design domain corresponding to each of the discrete elements; inputting the current local compositions into the discrete elements of the physics solver to obtain a current value of the design objective; and using the current value of the design objective to find a loss gradient of a loss function. The loss gradient is used as a sensitivity value to update the neural network during the iterations. After completion of the iterations, the updated neural network is used to define a topology of the structure.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures. The drawings are not necessarily to scale.

FIG. 5 is a listing of an algorithm according to an example embodiment;

FIG. 8 is a listing of an algorithm according to another example embodiment;

FIG. 9 is a table of solution parameters according to an example embodiment;

DETAILED DESCRIPTION

Figure 1:
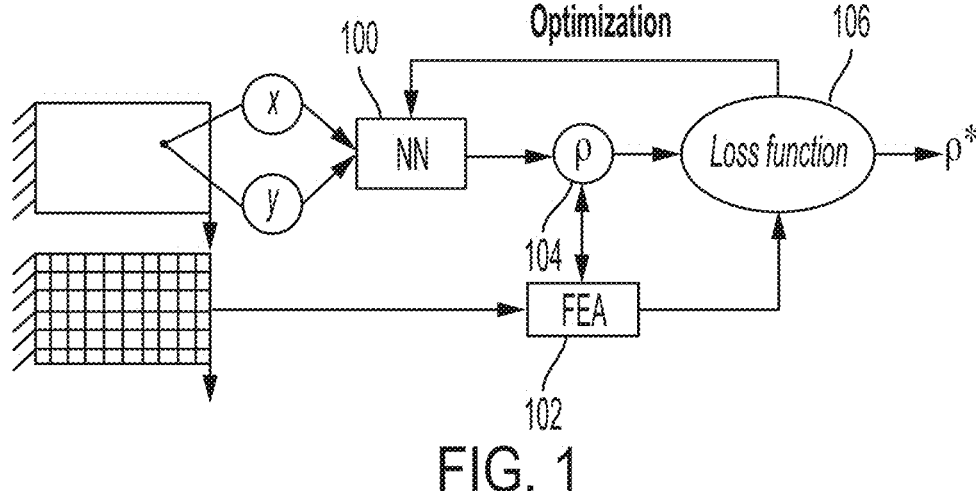
FIG. 1 is a diagram showing a neural network solution framework according to an example embodiment.

The present disclosure relates to designing parts that are formed using processes such as additive manufacturing (AM). Fabricating a part through AM involves progressively adding or depositing material onto a part being fabricated, often by adding successive layers, until the part approximates an intended shape and size, such as used with three-dimensional (3D) printing through fused deposition modeling (FDM). Other AM processes include laser metal sintering.

Additive manufacturing is gaining increasing popularity in industrial applications such as aerospace, automotive, medical, etc., where its capability in fabricating geometrically complex parts can be leveraged in producing high-performance, lightweight, and cost-efficient designs. The design of mission-critical parts suitable for real-world applications require solving sophisticated physics and incorporating multiple performance and manufacturing constraints. Further, current design frameworks are incapable of directly working with black-box solvers that encapsulate domain-specific knowledge. Thus, developing an end-to-end solution on a case-by-case basis can be extremely time consuming, expensive, and limited in its application scope.

A general approach that can directly incorporate complex physical quantities of interest, black-box solvers, as well as manufacturing constraints upfront in the design stage can potentially reduce the trial-and-error cost drastically. One such application is the design of optimized Fiber Reinforced Composite (FRC) structures. In this disclosure, topology optimization (TO) method is described for the design of such structures, which comprise regions of isotropic base matrix with anistropic optimally oriented fiber inclusions and voids. The concentration of the inclusions can be allowed to vary spatially within the matrix as required. A post-processing algorithm can tailor the fiber spacing based on the obtained concentration. The topology is tailored to maximize defined structural performance objective while constraining the matrix and fiber volumes.

The work is partly motivated by advent of modern manufacturing methods allowing the fabrication of continuous FRCs and their wider application in the automotive industry, robotics applications, as well as aeronautical and aerospace engineering due to their high stiffness-to-weight ratios. The proposed method extends the Neural Network (NN) based TO framework where the weights of the network are optimized to capture the density field as implicit function of spatial coordinates. (see Chandrasekhar, A. and Suresh, K. (2020b). "TOuNN: Topology optimization using neural networks," *Structural and Multidisciplinary Optimization.*) The compact, mesh independent, NN based representation accommodates for extracting long fibers via post processing. Further, automatic differentiation (which can be provided by backpropagation through a neural network) can be used for sensitivity analysis by expressing computations in an end-to-end differentiable fashion. This allows to quickly experiment with material models and design objectives without having to re-derive sensitivity expressions. It also enables considering more sophisticated physics and constraints without deriving sensitivity expressions analytically. Several numerical experiments have been carried out to establish the validity, robustness, and computational efficiency of the method.

The field of TO has been well-established with various approaches such as density based, method of morphable components, level-set method, topological sensitivity, etc. A density-based formulation is employed in the embodiments discussed below. The density-based approaches such as Solid Isotropic Material with Penalization (SIMP) have been classically devoted to solving a two-phase solid/void optimization problem for varying objectives such as compliance minimization, design of compliant mechanism, stress constraints, thermo-fluidic objectives etc. The current work focuses on the first two objectives. Expanding on optimization of density, the orientation of the material was further included in the optimization. Optimally oriented material significantly improves performance and offers higher stiffness to weight ratio.

While restrictive analytical methods have been proposed to optimize orientation of fibers in TO, current trends in gradient-based design of FRC's using TO can be broadly classified into (a) Continuous Fiber Angle Optimization (CFAO) (b) Discrete Material Optimization (DMO) and (c) Free Material Optimization (FMO). In CFAO, the orientations of the fiber are posed directly as the design variable, allowing it to assume any value. In contrast, DMO builds on multi-phase optimization and restricts the orientation to predetermined discrete values. While DMO approaches are often simpler with better convergence, they suffer from limitations, such as the resulting design having short discontinuous fiber paths. Short fibers are not only difficult to manufacture, but also mechanically inferior to long, continuous fibers. In FMO, the individual components of the elasticity tensor are treated as design variables, leading to designs that may be theoretically optimal but lack a physical correspondence.

Embodiments described herein include a NN-based representation whose weights directly capture the topology as an implicit function of spatial coordinates. The analytical representation allows for capturing the fiber concentration smoothly over the domain. Further, the ability to query the NN at any location post-optimization allows for the extraction of continuous long fibers. Performing the computation in an end-end differentiable fashion allows for automated sensitivity analysis paving way for faster and easier experimentation. The NN offers a mesh-independent representation allowing for capturing the matrix density, fiber concentration and orientation compactly using relatively small number of design variables.

Then, by relying on a gradient based optimization, a loss function reflecting the defined optimization problem, the three topological fields are simultaneously optimized via the network's weights. Posing the optimization with the NN weights as design variables in lieu of the orientation directly as the design variable results in the optimizer not getting stuck in local optima and face other convergence issues as often reported in CFAO technique.

In order to better understand the use of NN to represent SIMP density fields, the diagrams in FIGS. 1-5 illustrate an example of using a NN for optimizing topology of a structure in which anisotropy of the material is not considered in by optimizer. In typical single-material SIMP, the design is represented by the pseudo-density values at discrete finite elements $0 \leq \rho_e \leq 1$. The same discretization is used for FEA to evaluate the field variable (u) and correspondingly the performance objective function (J) and other constraints (g). Given the analytical expressions for gradients with respect to the pseudo-density design variables, the elemental sensitivity values are computed. Then, by relying on standard SIMP penalization technique, the density values are updated using gradient based methods (e.g., optimality criteria or method of moving asymptotes).

This coupling of representations for analysis and design can pose limitations in fidelity and accuracy of design features across different scales. Further, deriving the analytical expressions for sensitivity formulation can be tedious and challenging. The proposed NN approach decouples the representation for design (NN weights) from that of FEA (discrete elements), which enables geometric queries at high resolution (e.g., fiber orientation) while leveraging the efficiency of FEA. In other words, the design variables (e.g., composition of elements) are captured externally using a NN's activation functions and weights and is independent of the underlying mesh. Thus, by relying on an appropriate material model and a loss function reflecting the objectives and constraints problem, the design is optimized using the NN's built-in optimizer.

In the SIMP approach, the TO problem is converted into a continuous optimization problem using an auxiliary density field p defined over the domain. Assuming the volume constraint is active, as is typically assumed in such compliance minimization problems, the topology optimization problem can be posed as:

$$\underset{\rho}{\text{Minimize}} \quad u^T K(\rho) u \tag{1a}$$

$$\text{subject to} \quad K(\rho) u = f \tag{1b}$$

$$\sum_e \rho_e v_e = V^* \tag{1c}$$

where u is the displacement field, K is the finite element stiffness matrix, f is the applied force, $\rho_e$ is the density associated with element e, $v_e$ is the volume of the element, and V* is the prescribed volume.

While the density field is typically represented using the finite element mesh, in this example, it can be constructed independently via activation functions associated with a NN. In other words, given any point in the domain, the NN will output a density value as shown in FIG. 1, which is a diagram of the NN 100 and problem domain used in this example. Using this transformation, the constrained optimization problem in Equation (1) is converted into an unconstrained penalty problem by constructing a loss function (as explained later below). The loss function is minimized by employing standard machine-learning (ML) techniques. In ML, optimization is often referred to as training, sensitivity analysis as back-propagation (or automatic differentiation), and iteration as epoch.

Figure 2:
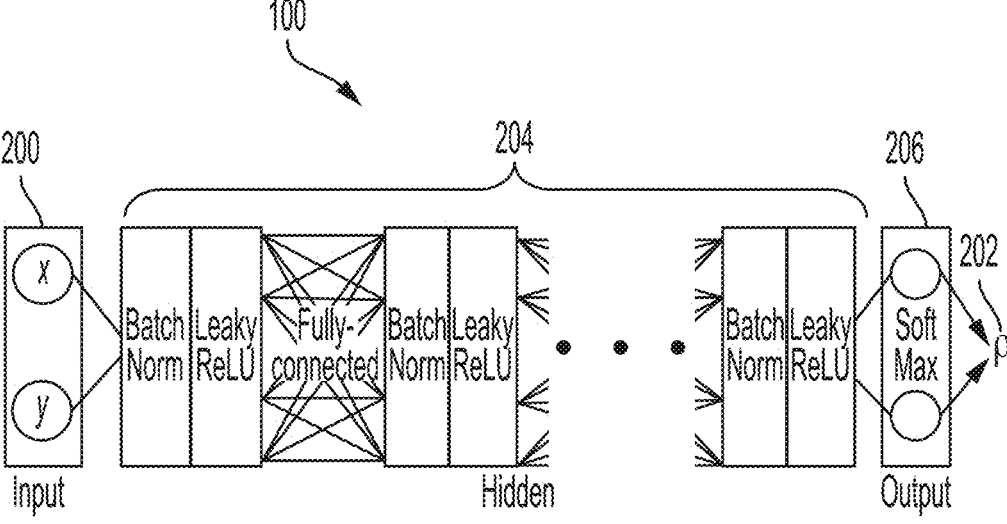
FIGS. 2 and 3 are diagrams showing features of a neural network according to an example embodiment.

While there are various types of NNs, this example employs a simple fully-connected feed-forward NN 100, as shown in the diagram of FIG. 2. The input 200 to the network 100 is either two-dimensional (x, y) for 2D problems, or three-dimensional (x, y, z) for 3D problems. The output 202 of the NN is the density value p at that point. In other words, the NN 100 is an evaluator that return the density value as output 202 for any point within the domain. The value returned will depend on the weights, bias and activation functions, as described below.

Figures 3, 4:
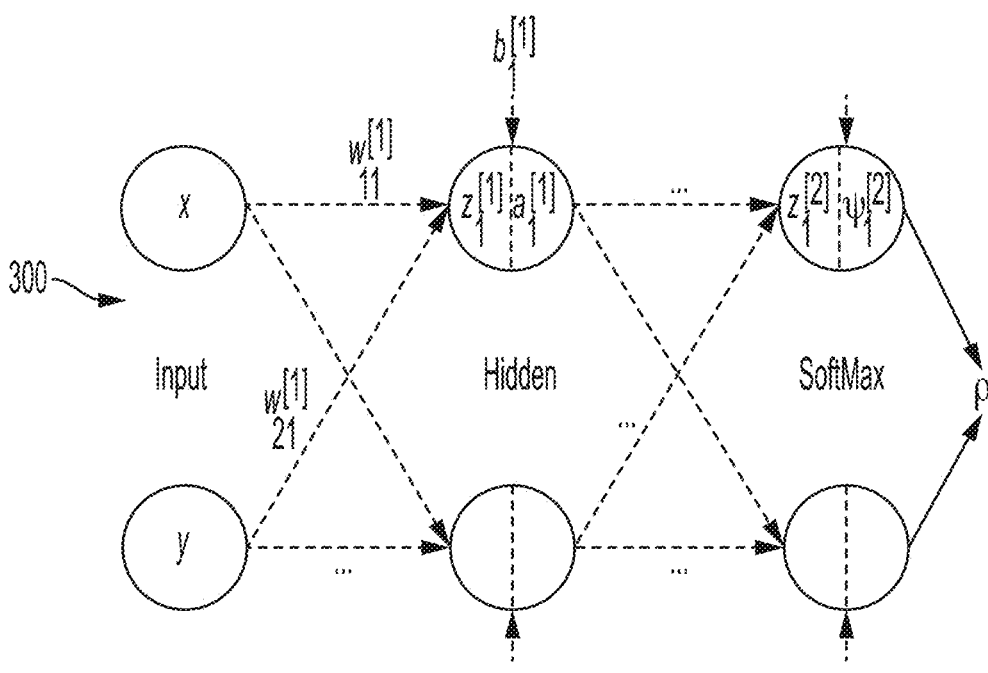
FIG. 4 is an output function equation used in a neural network according to an example embodiment.

The NN itself includes a series of hidden layers 204 associated with activation functions such as leaky rectified linear unit (LeakyReLU) coupled with batch normalization. The final layer 206 of the NN 100 is a classifier layer with a softMax activation function that ensures that the density lies between 0 and 1. As illustrated in FIG. 2, the NN 100 typically includes several hidden layers (depth); each layer may include several activation functions (height). By varying these two, the representational capacity of the NN can be adjusted as needed to fit the problem domain. As an example, FIG. 3 illustrates a NN 300 with a single hidden layer of height 2. Observe that each connection within the NN is associated with a weight, and each node is associated with an activation function and a bias. The value of $z_1^{[1]}$ is first computed as $z_1^{[1]}=w_{11}^{[1]}x+w_{21}^{[1]}y+b_1^{[1]}$, where $w_{ij}^{[k]}$ is the weight associated to the $j^{th}$ neuron in layer k from the $i^{th}$ neuron in the previous layer, and $b_j^{[k]}$ is the bias associated with the $j^{th}$ neuron in the $k^{th}$ layer. Then, the output $a_1^{[1]}$ of the node is computed as $a_1^{[1]}=s(z_1^{[1]})$ where s is the chosen activation function. For example, the ReLU activation function is defined as: s(z) max(0, z). In this example, a variation of the ReLU is used, namely, LeakyReLU that is differentiable. This and other differentiable activation functions are supported by various NN software libraries such as pyTorch.

The final layer, as mentioned earlier, is a softMax function that scales the outputs from the hidden layers to values between 0 and 1. For example, in FIG. this results in $\psi_1^{[1]}$ calculated as shown in FIG. 4. The softMax function has many outputs as inputs. Only the first output is used here, and it is interpreted as the density field $(\rho=y_1^{[2]}y_1^{[2]})$. The remaining outputs are disregarded, but can be used, for example, in a multi-material setting.

As should be clear from the above description, once the activation function is chosen, the output $\rho(x, y)$ is defined globally, and determined solely by the weights and bias. The entire set of weights and biases are denoted by w. Thus, the optimization problem using the NN may be posed as:

$$\underset{w}{\text{Minimize}} \quad u^T K(w)u \tag{2a}$$

$$\text{subject to} \quad K(w)u = f \tag{2b}$$

$$\sum_e \rho_e(w)v_e = V^* \tag{2c}$$

The element density value $\rho_e(w)$ in the above equation is the density function evaluated at the geometric center of the element. For 2D finite element analysis, a regular four node quad element can be used, and fast Cholesky factorization based on the CVXOPT library. For 3D, a regular eight node hexahedral element can be used with an assembly free deflated finite element solver. In reference again to FIG. 1, note that the FE solver 102 is outside of the NN 100, and is treated as a black box by the NN 100. During each iteration, the density 104 at the center of each element is computed by the NN 100, and is provided to the FE solver 102. The FE solver 102 computes the stiffness matrix for each element based on the density evaluated at the center of the element. Note that, since the density function can be evaluated at multiple points within each element, it is possible to use advanced integration schemes to compute a more accurate estimate of element stiffness matrices. The assembled global stiffness matrix is then used to compute the displacement vector u, and the un-scaled compliance of each element given in Equation (3) below. The total compliance is given in Equation (4), where p is the usual SIMP penalty parameter.

$$J_e=\{u_e\}^T[K]_0\{u_e\} \tag{3}$$

$$J=\Sigma_e\rho_e^p J_e \tag{4}$$

While the optimization is usually carried out using optimality criteria or MMA, this example uses NNs, which are designed to minimize an unconstrained loss function (see loss function 106 in FIG. 1) using built-in procedures such as Adam optimization. Therefore, the constrained minimization problem in Equation (1) is converted into an unconstrained minimization problem by relying on the penalty formulation to define the loss function as shown in Equation (5), where $\alpha$ is a penalty parameter, and J0 is the initial compliance of the system, used here for scaling.

$$L(w) = \frac{u^T K u}{J^0} + \alpha\left(\frac{\sum_e p_e v_e}{V^*} - 1\right)^2 \tag{5}$$

The solution of the constrained problem is obtained by minimizing the loss function as follows. Starting from a small positive value for the penalty parameter $\alpha$, a gradient driven step is taken to minimize the loss function. Then, the penalty parameter is increased and the process is repeated. Observe that, in the limit $\alpha\rightarrow\infty$, when the loss function is minimized, the equality constraint is satisfied and the objective is thereby minimized. In practice, a maximum value of 100 is usually assigned for $\alpha$. The complete update scheme is described later in Algorithm 1. Other methods such as the augmented Lagrangian may also be used to convert the equality-constrained problem into an equivalent unconstrained problem.

Sensitivity analysis is an integral part of any optimization framework including NN. Neural networks rely on back-propagation to analytically compute the sensitivity of loss functions with respect to the weights and bias. This is possible since the activation functions are analytically defined, and the output can be expressed as a composition of such functions. Thus, in theory, once the network is defined, no additional work is needed to compute sensitivities; it can be computed automatically (and analytically) via back-propagation. However, in the current scenario, the FE implementation is outside of the NN (see FIG. 1). Therefore, some of the sensitivity terms will be computed explicitly. While outside the scope of this disclosure, one technique is described in "TOuNN: Topology optimization using neural networks," by Chandrasekhar, A. and Suresh, K., Structural and Multidisciplinary Optimization (2020b), which is incorporated herein by reference.

As seen in the table of FIG. 5, the proposed framework is summarized through an explicit algorithm. It is assumed that the NN has been constructed with a desired number of layers, nodes per layer and activation functions, using a tool such as pyTorch. The weights and bias of the network are initialized using Glorot normal initialization. The first step in the algorithm is to sample the domain at the center of each element; this is followed by the initialization of the penalty parameter and the SIMP parameter p. In the main iteration, the element densities are computed using the NN using the current values of w. These densities are then used by the FE solver to solve the structural problem, and to compute the un-scaled element compliances $J_e$ defined in Equation (3). Further, in the first iteration, a reference compliance $J^0$ is also computed for scaling purposes. Then, the loss function is computed using Equation (5) and the sensitivities are computed. The weights w are then updated using the built-in optimizer (here Adam optimizer). This is followed by an update of the penalty parameter $\alpha$. Finally, the continuation scheme is used where the parameter p is incremented to avoid local minima. The process is then repeated until termination. In typical mesh-based density optimization, the algorithm terminates if the maximum change in element density is less than a prescribed value. Here, since the density is a globally function, the algorithm is set to terminate if the percentage of grey elements (elements with densities between 0.05 and 0.95) $\epsilon_g = N_{grey}/N_{total}$ is less than a prescribed value. Through experiments, this criterion is observed as robust and consistent with the formulation.

The above example optimizes a structure without regards to anisotropy of the materials. Additional features are described that can allow a neural network to perform a similar optimization, but using composite material comprising anisotropic elements embedded in a matrix material, which will be described here as an FRC-TO optimization, even though it may apply to other anisotropic materials and structures, e.g., structural reinforcement sheets embedded in a 3D volume. Note that the matrix material may be isotropic or anisotropic. The algorithm will not explicitly adjust the orientation of the matrix material during optimization, however matrix anisotropy may still affect the compliance results obtained using the FE solver. The orientation of the anisotropic elements (e.g., fibers) will be adjusted during optimization.

In FIG. 6-10, diagrams provide details of a solution for anistropic materials, where the spatial coordinates from the Euclidean space are mapped to the frequency space. The design is implicitly represented by a fully-connected feedforward NN with its output layer comprising three neurons corresponding to the matrix-topology, fiber-density, and fiber-orientation. As the finite element analysis (FEA) is performed within an NN framework (e.g., PyTorch), automatic differentiation via the NN is leveraged to compute the sensitivities and update the NN weights (e.g., Adam optimizer). Once the NN is trained, e.g., once the optimization is complete, a high-resolution FRC design can be extracted and fabricated, for instance, using additive manufacturing (AM)

Figures 6, 7:
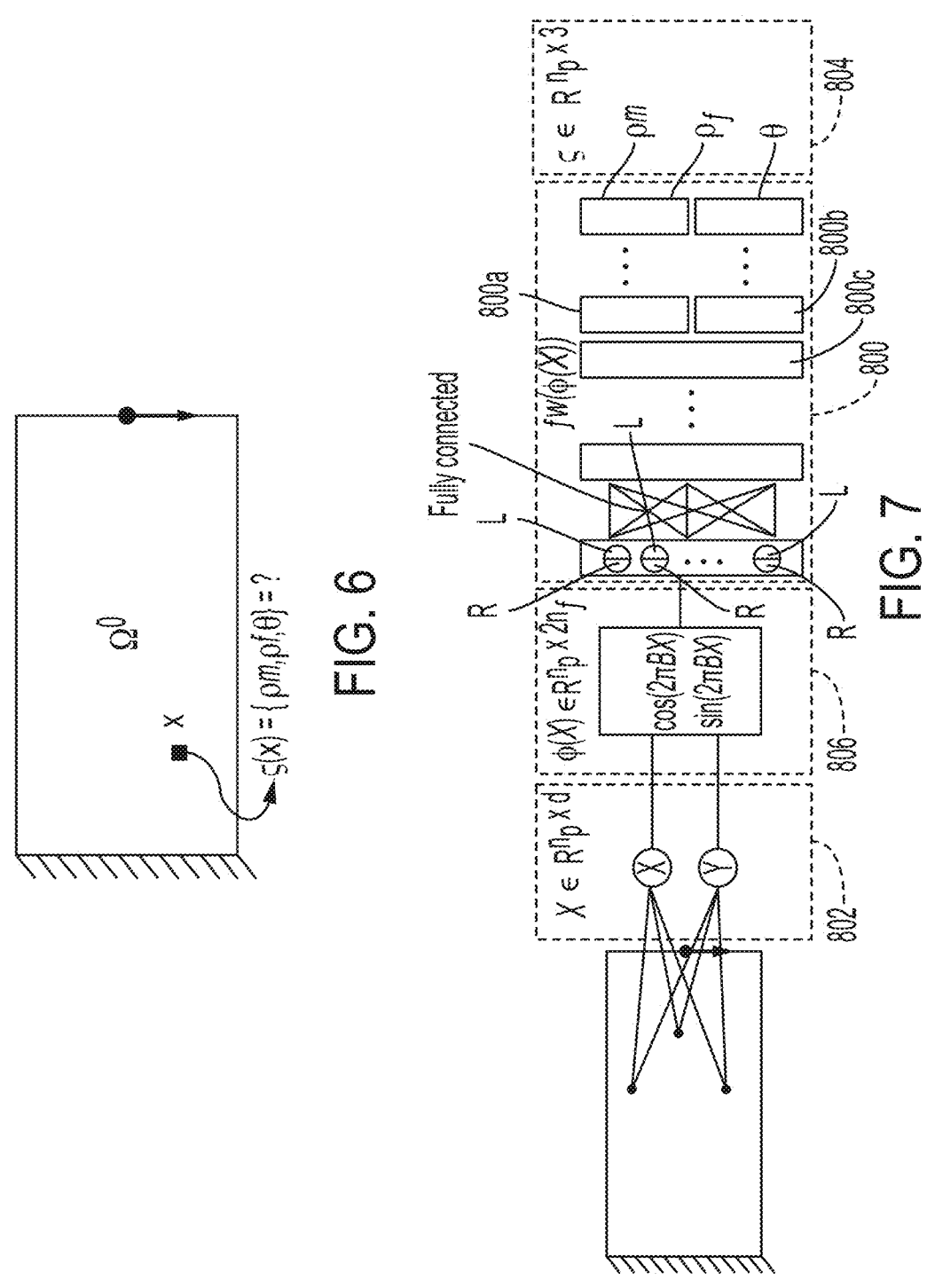
FIG. 6 is a diagram of an example problem domain demonstrate an optimization method according to an example embodiment.
FIG. 7 is a diagram of a neural network according to another example embodiment.

As seen in the diagram of FIG. 6, an example design domain includes geometric extends, loads and restraints (boundary conditions) that will be used demonstrate the optimization procedure and provide computational results. The objective here is to simultaneously optimize the matrix geometry and the fiber layout to minimize the objective function while satisfying volume constraints on both matrix and fiber. Defining the fiber layout comprises optimizing its spatially varying concentration and orientation. Consequently, the FRC-TO problem can be mathematically represented as in (6a)-(6d) below, where J is the design objective with the topology described by matrix density $\rho_m$, fiber concentration $\rho_f$ and orientation $\theta$ being the design variables.

$$\underset{\zeta}{\text{Minimize}} \quad J(\zeta) \tag{6a}$$

$$\text{subject to} \quad K(\zeta)u = f \tag{6b}$$

$$g_m(\rho_m) := \frac{\sum_e \rho_m(x_e)v_e}{V_m^* \sum_e v_e} - 1 = 0 \tag{6c}$$

$$g_f(\rho_f) := \frac{\sum_e \rho_f(x_e)v_e}{r_f^* V_m^* \sum_e v_e} - 1 = 0 \tag{6d}$$

The material description at any point x is represented at any point x as $\zeta(x)=\{\rho_m(x); \rho_f(x); \theta(x)\}$. The matrix is modeled using a SIMP-based density field, $\rho_m \in [0, 1]$. The fiber concentration is modeled as a continuous variable $\rho_f \in [0, 1]$, where $\rho_f=0$ represents no fiber inclusion and $\rho_f=1$ represents matrix with complete fiber inclusion (within limits defined by $r^*_f$ below). The angle $\theta \in [-\pi/2; \pi/2]$ is the orientation of the included fiber. Further, $K(\zeta)$ is the standard finite element stiffness matrix that depends on the material composition, f is the imposed load, and u is the displacement field. Equations (6c) and (6d) are the constraints on the volume of the matrix and fiber respectively. Here $v_e$ the volume/area of element and $V^*_m$ is the imposed allowed volume fractions of the matrix. The value of $r^*_f \in [0, 1]$ denotes what fraction of the matrix can be filled with fiber. The variable $r^*_f=1$ denotes that the matrix be allowed to be completely filled with fiber leading to stiffest design and vice-versa. Observe that while the constraints (Eq. 6c-6d) are often expressed as inequalities, they are expressed as equalities here assuming that they are always active at optimal conditions. Finally, while the range of the design variables are often imposed as box constraints, they are imposed here via judicious choice of the activation function in the NN's output layer.

Typically, in density based TO, the material description defined over the domain $\Omega^0$ is captured using the underlying FE mesh $\Omega^0_h$. On the other hand, the material description is captured implicitly using the NN activation functions and weights. This mesh-independent NN based representation allows for: (1) accurate and automatic computation of sensitivities by exploiting the NN's back-propagation capabilities; (2) analytical and differentiable definition of topology, allowing the extraction of continuous fibers; and (3) concise description with the number of design variables remains constant with increasing mesh size or domain dimension.

As seen in the block diagram of FIG. 7, a fully connected feed-forward NN 800 is used to optimize the design variables. The input 802 to the network is either 2-dimensional (x, y) for 2D problems, or 3-dimensional (x, y, z) for 3D problems. The output 804 of the NN 800 is the material description at that point. In other words, the NN 800 evaluates the material description for any point within the domain; the value returned will depend on the weights, bias and activation functions of the network. The construction of the NN is detailed below.

The input 802 to the NN are a set of np points sampled from the input domain i.e., $X \in \mathbb{R}^{n_p \times d}$, where d is the dimension of the input domain. The relatively low dimension coordinate inputs give these NN the name Coordinate Based Neural Networks (CBNN's). At block 806, the sampled points from the Euclidean input space are first transformed into a frequency space $(X \rightarrow \phi)(X))$ before passing the frequency domain features to the NN 800. Recognizing that NNs suffer from capturing finer features, e.g., high frequency variations, the projection ameliorates this, facilitating the capture of finer topological features. This also offers an approximate control over the length scales as well as improves convergence rate. The embedding $\phi(X)=[\cos(2\pi XB); \sin(2\pi XB)]^T$, where the matrix $B \in \mathbb{R}^{d \times n_f}$ is sampled uniformly from $$\mathcal{U}\left(\frac{h}{l_{max}}, \frac{h}{l_{min}}\right),$$

with h being a reference length (here the FE mesh size), $I_{max}$, $I_{min}$ being the approximate length scales in the topology. For a detailed discussion, see Tancik, M., Srinivasan, P. P., Mildenhall, B., Fridovich-Keil, S., Raghavan, N., Singhal, U., Ramamoorthi, R., Barron, J. T., and Ng, R, (2020), "Fourier features let networks learn high frequency functions in low dimensional domains," *arXiv preprint arXiv:2006.10739*.

The hidden layers ($\phi(X) \rightarrow f_w(\phi(X))$) include of a series of fully connected feed-forward layers activated by the Swish activation function (Swish(x)=x.sigmoid(x)). Further, the output defines material placement (via the matrix density) and fiber concentration and material orientation of the fibers. To capture this logical distinction, a fork is introduced in the hidden layers where two prongs of fully connected layers separate from an intermediate hidden layer, shown here as forked layers 800a, 800b that separate from hidden layer 800c. One forked layer 800a is trained to optimize the matrix density and concentration of fiber ($\rho_m$, $\rho_f$), and the other forked layer 800b is trained to optimize fiber orientation ($\theta$).

The output layer ($f_w(\phi(X)) \rightarrow \zeta(X)$) includes three neurons collectively representing $\zeta = \{\rho_m; \rho_f; \theta\}$. The output layer is activated via a sigmoid function $\sigma(\bullet)$ to ensure the outputs are in range (0; 1). Further, the sigmoid activated orientation neuron is linearly transformed as $$\theta \leftarrow = -\frac{\pi}{2} + \pi\sigma(\theta)$$

to have its output in the range $$\left(-\frac{\pi}{2}, \frac{\pi}{2}\right).$$

The obtained material description is then processed via the material model as discussed below.

The material at each point in the input domain is considered as either void, isotropic base matrix, or matrix embedded with anisotropic fibers. The fibrous material is generally stronger than the base matrix, with considerable strength along the fiber axis. The orientation and concentration of these fibers is spatially variant as to be determined by the optimizer, and the illustrated example is a planar formulation. The base material is characterized by its Elastic Modulus $E_m$ and Poisson's ratio $v_m$. The composite is characterized by the Elastic Modulus along two axis $E^{\parallel}_f$, $E^{\perp}_f$, Poisson's ratio $v_f$ and Shear Modulus $G_f$. The matrix is represented using a standard two-phase SIMP material mode. The SIMP penalization function drives the matrix density towards {0; 1}. On the other hand, the fiber concentration is left un-penalized. Additionally, the base constitutive tensor of the fiber is rotated as dictated by it orientation. The effective Elasticity tensor [D] at a point x can then be expressed as in Equation (7) below, where p is the SIMP penalty parameter, $[\mathcal{T}_1]$ and $[\mathcal{T}_2]$ are transformation matrices (see Equation(8), where m=cos $\theta$ and n=sin $\theta$), $[D_f^0]$ and $[D_m^0]$ are the constitutive matrices of the fiber and base matrix respectively.

$$[D(x)] = \rho_m^p(x)\left(\rho_f(x)[\mathcal{T}_1(\theta(x))]^{-1}[D_f^0][\mathcal{T}_2(\theta(x))] + (1 - \rho_f(x))[D_m^0]\right) \quad (7)$$

$$[\mathcal{T}_1] = \begin{bmatrix} m^2 & n^2 & mn \\ n^2 & m^2 & -2mn \\ -mn & mn & m^2-n^2 \end{bmatrix}, [\mathcal{T}_2] = \begin{bmatrix} m^2 & n^2 & mn \\ n^2 & m^2 & -mn \\ -2mn & 2mn & m^2-n^2 \end{bmatrix} \quad (8)$$

The physical simulation is performed using conventional Finite Element Analysis. The input domain is discretized using geometrically congruent four node grid mesh. The element stiffness matrix is in Equation (9) below, where $[\nabla N_e]$ is the gradient of the shape matrix, $\Omega_e$ is the element domain $[D(x_e)]$ is elasticity tensor as in Equation (7) that is evaluated at the center of element e. The geometric congruency of the elements is exploited to significantly reduce computational cost. In particular, template stiffness matrices are precomputed, $[\hat{K}_i]$ i=1, 2, . . . , 6. Then, during optimization only the elasticity tensor of the elements is computed as in Equation (7) and the stiffness matrix is obtained as Equation (10). The FE computation can be expressed in PyTorch using a sparse end-end differentiable solver. This allows for automated sensitivity analysis rather than manual derivation and implementation of the sensitivities $$[K_e] = \int_{\Omega_e} [\nabla N_e]^T [D(x_e)][\nabla N_e] d\Omega_e \quad (9)$$

$$[K_e] = D_{11}(x_e)[\hat{K}^1] + D_{22}(x_e)[\hat{K}^2] + D_{33}(x_e[\hat{K}^3] + D_{12}(x_e)$$
$$[\hat{K}^4] + D_{13}(x_e[\hat{K}^5] + D_{20}(x_e)[\hat{K}^6] \quad (10)$$

The constrained optimization problem in Equation (6) can be converted to an equivalent unconstrained loss suitable for a NN training/optimization framework. Relying on a simple penalty formulation, Equations (6a), (6c) and (6d) can be expressed as $$L(w) = \frac{J(\zeta(w))}{J_0} + \alpha_m g_m(\rho_m(w))^2 + \alpha_f g_f(\rho_f(w))^2 \quad (11)$$

where $\alpha$ is a penalty parameter and $J_0$ is the initial compliance, used here for scaling. compliance, used here for scaling. Observe that Equation (6b) is automatically satisfied when computing the state variable via FEA. Starting from a small positive value for $\alpha$, a gradient driven step is taken to minimize the loss function (Adam optimization). Then, the penalty parameter is increased and the process is repeated. Observe that $$\lim_{\alpha_m \to \infty} g_m \to 0 \text{ and } \lim_{\alpha_f \to \infty} g_f \to 0$$

as the loss function is minimized, thereby satisfying the equality constraint. While $\alpha_m$ and $\alpha_f$ are often independent, they are treated the same, i.e., $\alpha_m = \alpha_f = \alpha$ in these experiments.

An important factor to consider for the update schemes during optimization is the sensitivity, i.e., derivative, of the loss set forth in Equation (11) with respect to the weights of the NN. While the derivation and implementation of these are typically carried out manually, this can be laborious and often error prone. Instead, the autograd abilities of NN frameworks (also referred to herein as automatic differentiation or backpropagation) can be used to automate their computation. Autograd performs a systematic derivation of the sensitivity using the chain-rule. Thus, only the broader derivative terms are expressed in Equation (12). Note that the terms in curly braces in Equation 12 represent the sensitivities A, B, and C shown in FIG. 10.

$$\frac{\partial L}{\partial w} = \left\{ \frac{\partial L}{\partial J} \frac{\partial J}{\partial u} \left[ \frac{\partial Ju}{\partial \theta} \frac{\partial \theta}{\partial w} + \frac{\partial Ju}{\partial \rho_f} \frac{\partial \rho_f}{\partial w} + \frac{\partial Ju}{\partial \rho_m} \frac{\partial \rho_m}{\partial w} \right] \right\} + \tag{12}$$

$$\left\{ \frac{\partial L}{\partial g_m} \frac{\partial g_m}{\partial \rho_m} \frac{\partial \rho_m}{\partial w} \right\} + \left\{ \frac{\partial L}{\partial g_f} \frac{\partial g_f}{\partial \rho_f} \frac{\partial \rho_f}{\partial w} \right\}$$

Figure 10:
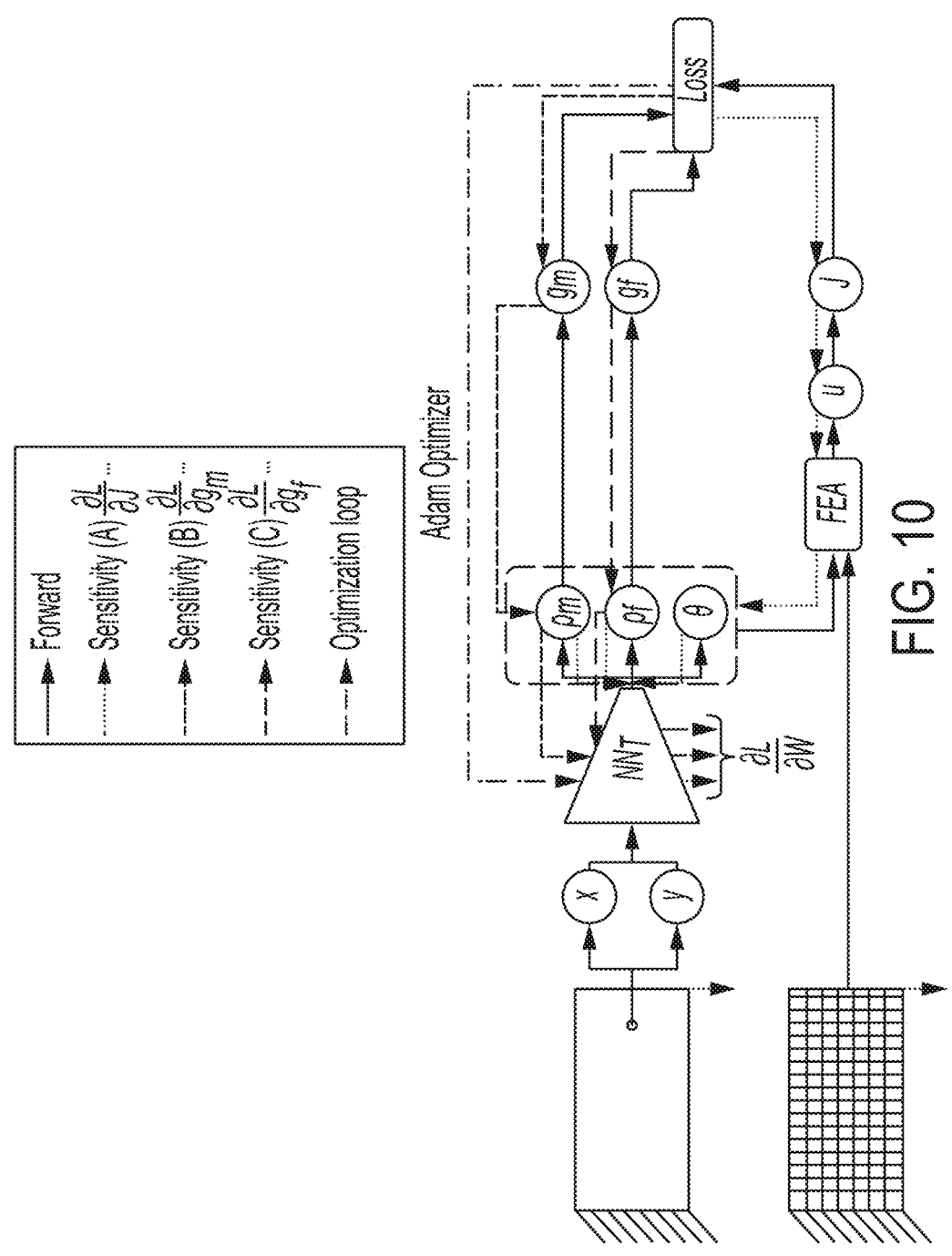
FIG. 10 is a diagram of an optimization framework according to an example embodiment.

The proposed framework is summarized in the algorithm shown in FIG. 8. It takes as input the problem setup consisting of initial domain and associated BC along with imposed volume constraints. The various parameters and their default values are summarized in the table of FIG. 9. The optimization framework, including forward and sensitivity computations, is schematically depicted in FIG. 10.

Figure 11:
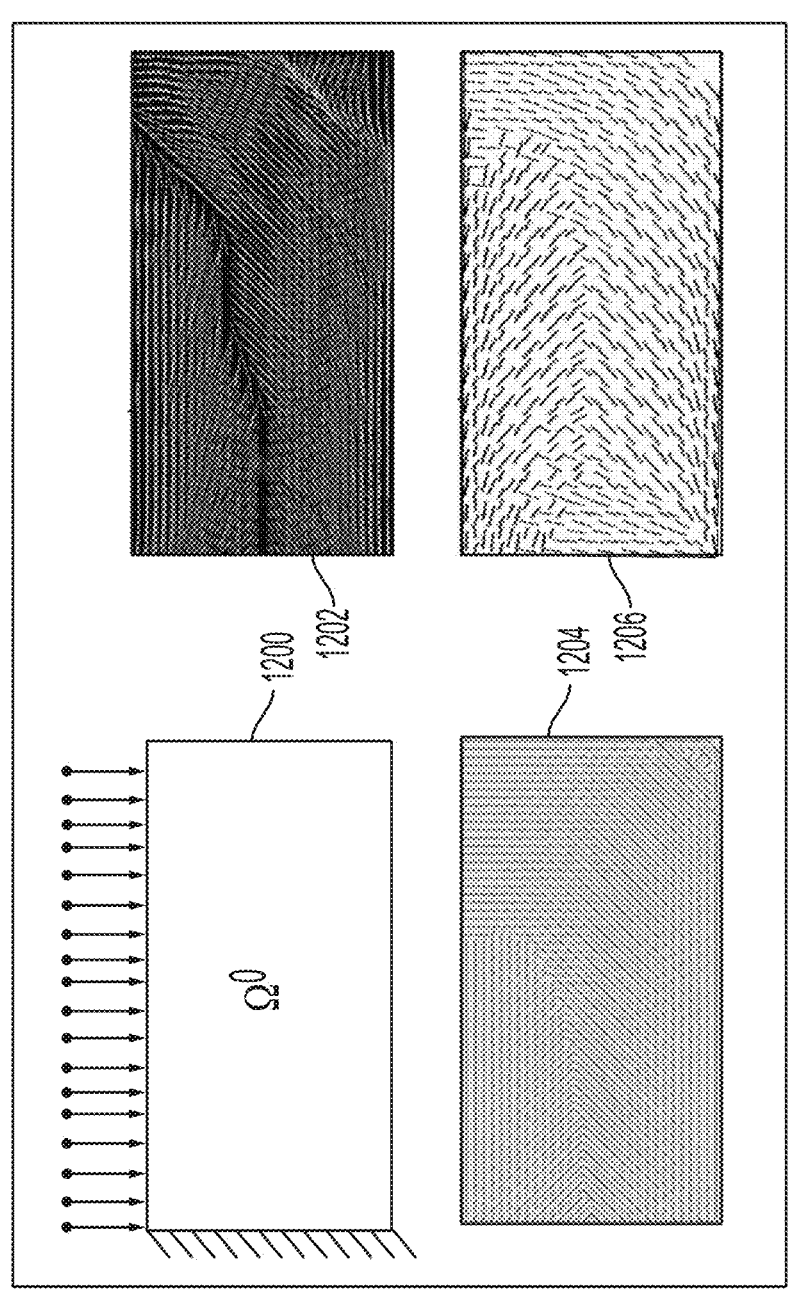
FIG. 11 is a set of diagrams showing numerical problem and comparison of a solution found using a method according to an example embodiment with other solutions.

In FIG. 11, a set of diagrams shows a numerical problem and comparison of other solutions with a solution using the above-described arrangement. Diagram 1200 is a schematic representation of the 2D problem to be optimized, which is a cantilevered beam that is uniformly loaded across its top edge. The constraint limits were set as follows: $V^*_m = r^*_f = 1$. The results obtained are shown in plot 1202 and compared to other reported topologies in plots 1204 and 1206. Plot 1204 shows a solution using a CFAO-based framework with a binary-valued fiber concentration at each point (Desai, A., Mogra, M., Sridhara, S., Kumar, K., Sesha, G., and Ananthasuresh, G. (2021), "Topological-derivative based design of stiff fiber-reinforced structures with optimally oriented continuous fibers," *Structural and Multidisciplinary Optimization*, 63(2):703-720). Plot 1206 shows a solution using SIMP with variable orientation (Pedersen, P. (1991), "On thickness and orientational design with orthotropic materials," *Structural Optimization*, 3(2):69-78). It can be seen that the topologies are comparable.

As a second validation experiment, the material model is modified and the results obtained compared against Desai et al. (2021). A two-phase model was proposed in Desai et al. (2021) where fibrous embedding is completely present or absent at any location in the matrix. To enforce this, the model is solved with $V^*_m = 1$ and the material model in Equation (7) is modified as, $$[D(x)] = \rho_m{}^P(x)(\rho_f(x)[\mathcal{T}_1(\theta(x))]^{-1}[D_f{}^o][\mathcal{T}_2(\theta(x))] + (1 - \rho_f(x))[D_m{}^o])) \tag{13}$$

Figure 12:
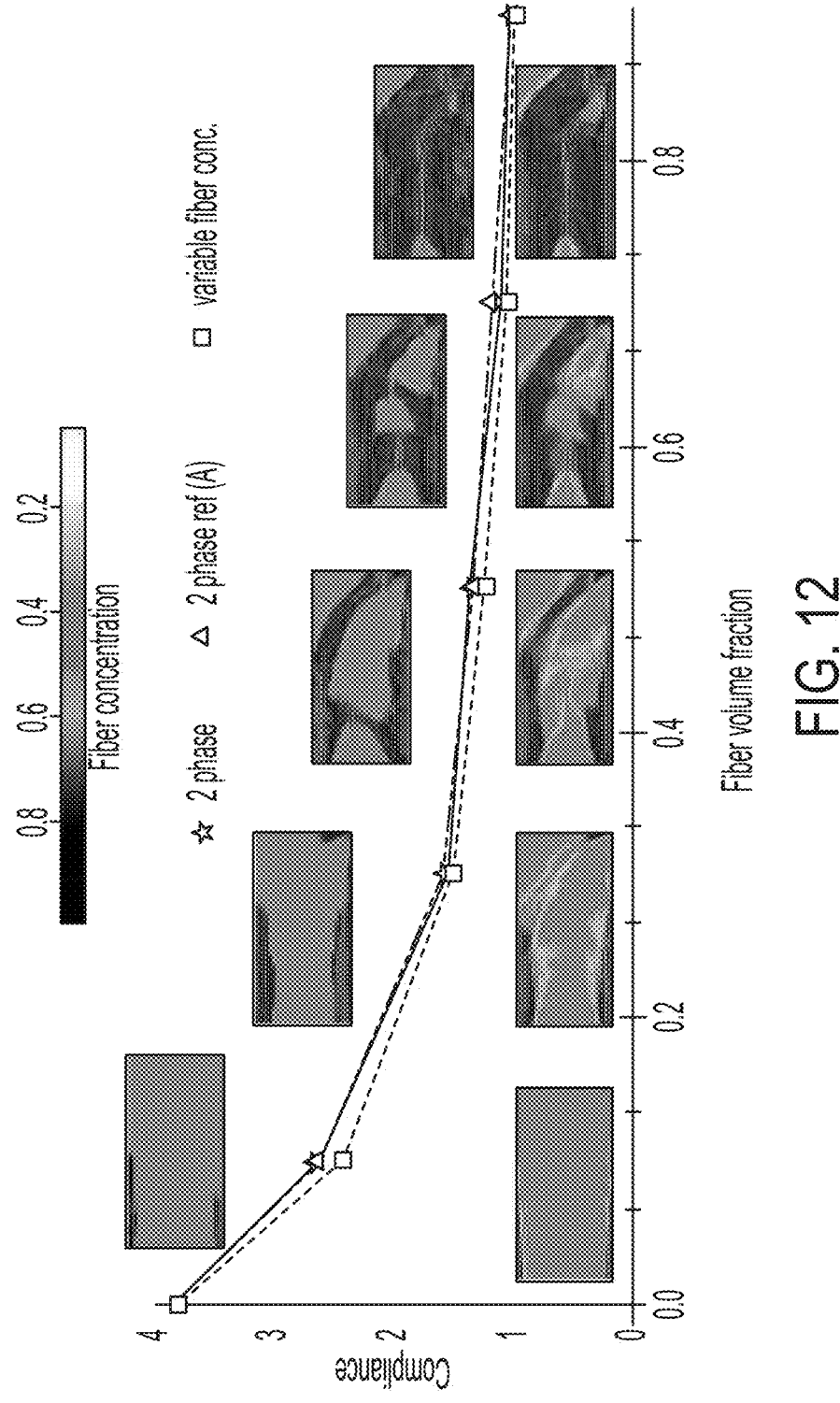
FIG. 12 is a plot showing solutions for different fiber volume fractions using a method according to an example embodiment.

Observe that penalizing the fiber concentration drives its value to either 1 or 0. Further, automatic differentiation can be used instead of re-deriving the sensitivity expressions. The allowed fiber concentrations $r^*_f$ were varied and the results are shown in FIG. 12. The reported compliance values are in close agreement with one another, thus validating our implementation. Further, the results were compared with the proposed material model in Equation (7) and the compliance and obtained topologies reported. It was observed that the material gradation as obtained by the variably spacing/concentration the fibers results in better designs with a lower compliance.

Figure 13:
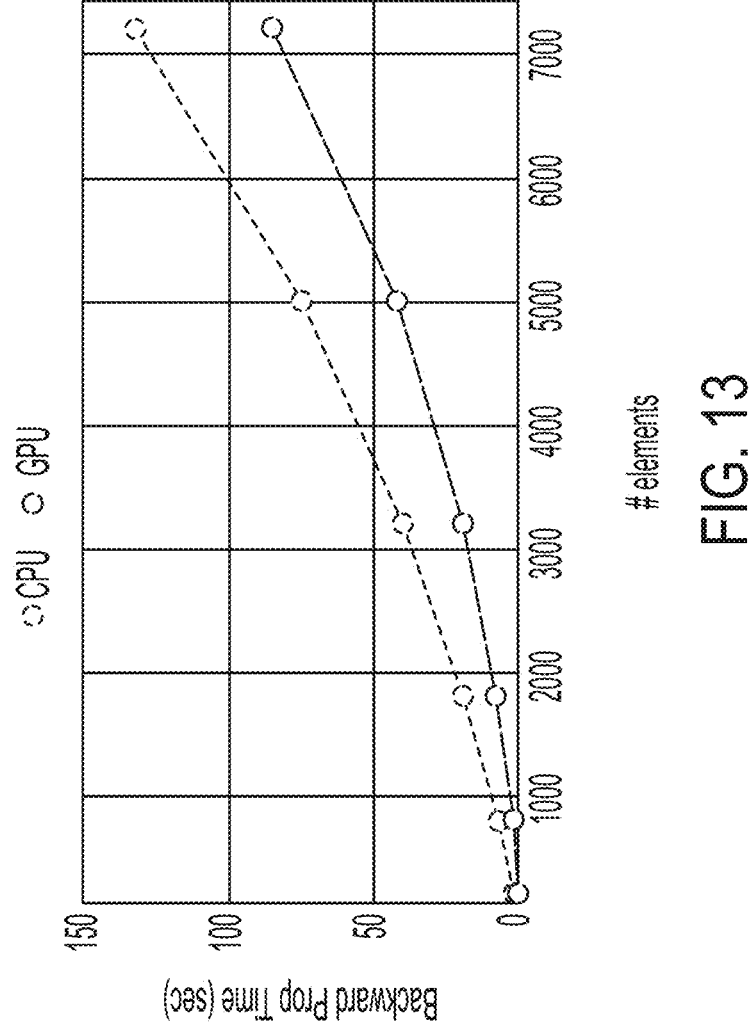
FIG. 13 is a graph showing computational costs with varying number of finite elements using a solver according to an example embodiment.

In FIG. 13, a graph summarizes the computational costs with varying number of FEA elements using a solver according to an example embodiment. All other parameters other than the number of FEA elements were kept constant at default values. The time taken for various operations in the optimization loop as labeled in FIG. 8: namely forward propagation (step 10), assembly (step 11 and 12), sparse FEA solve (steps 13-17), backward propagation (step 18), and Adam optimizer (step 19). The computations were performed on a desktop machine with Intel Corei7-7820X CPU with 8 processors running at 4.5 GHz, 32 GB of host memory, and an NVIDIA GeForce GTX 1080 GPU with 2,560 CUDA cores and 8 GB of device memory. The computational cost is dominated by backward-propagation in the NN, which consumed around 60-80% of the total CPU and around 50-75% of total GPU. The graph in FIG. 13 shows the computation time of backward propagation on CPU vs. GPU at different FEA model resolutions.

Figure 14:
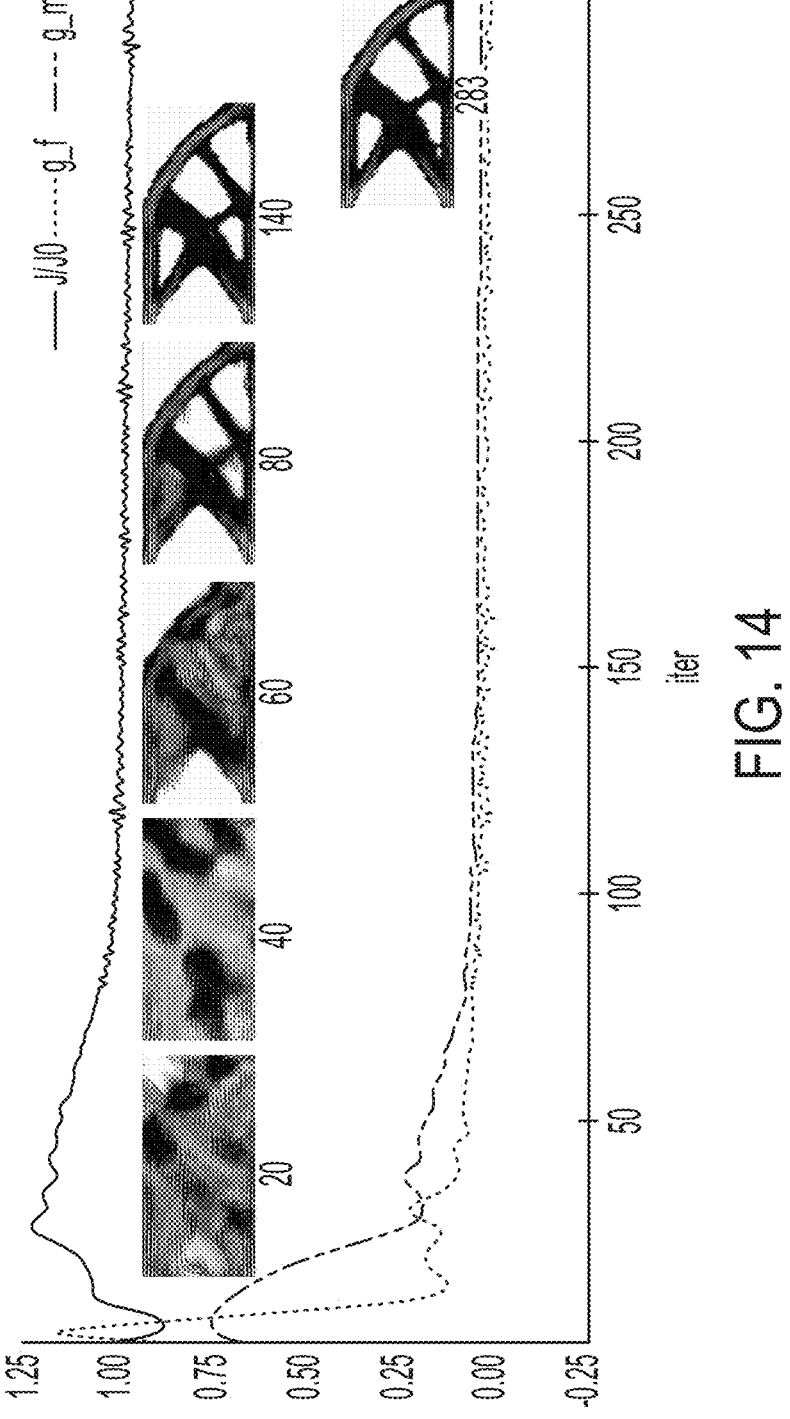
FIG. 14 is a diagram illustrating convergence of the proposed algorithm as a function of iterations according to an example embodiment.

In FIG. 14, a diagram illustrates the typical convergence of the proposed algorithm using the tip-cantilever beam (see FIG. 6) with $V^*_m = 0.5$ and $r^*_f = 0.4$. The convergence of the relative compliance, and the volume constraints on the matrix and fiber can be seen in the graph of FIG. 14. The topology at various iterations is illustrated in the inset. The convergence illustrates the stability of the simple penalty formulation and competitive number of iterations with classical formulations such as density-based TO with MMA. Other experiments exhibited similar convergence behavior.

Figure 15:
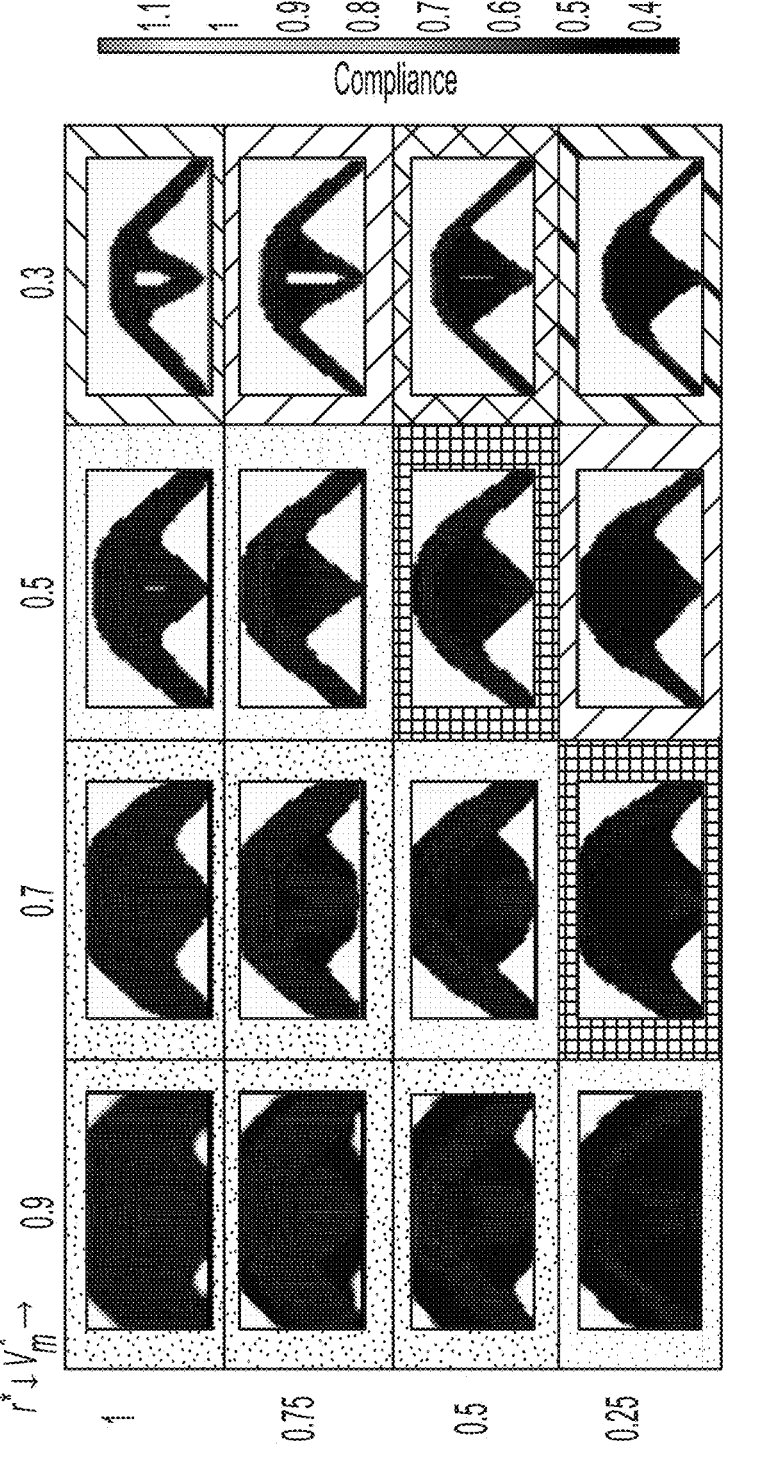
FIG. 15 is a diagram showing different results as a function of input parameters for a solver according to an example embodiment.

One consideration during the design stage is exploring the Pareto-front to make judicious engineering decisions. Towards that goal, the symmetric half of the Michell structure is considered and the compliance and topology for varying values of $V^*_f$ and $V^*_m$ is explored in FIG. 15. A restriction of $V^*_f \leq V^*_m$ is applied for physical validity. As expected, increasing compliance is observed as allowed volume fractions are lowered.

Figure 16:
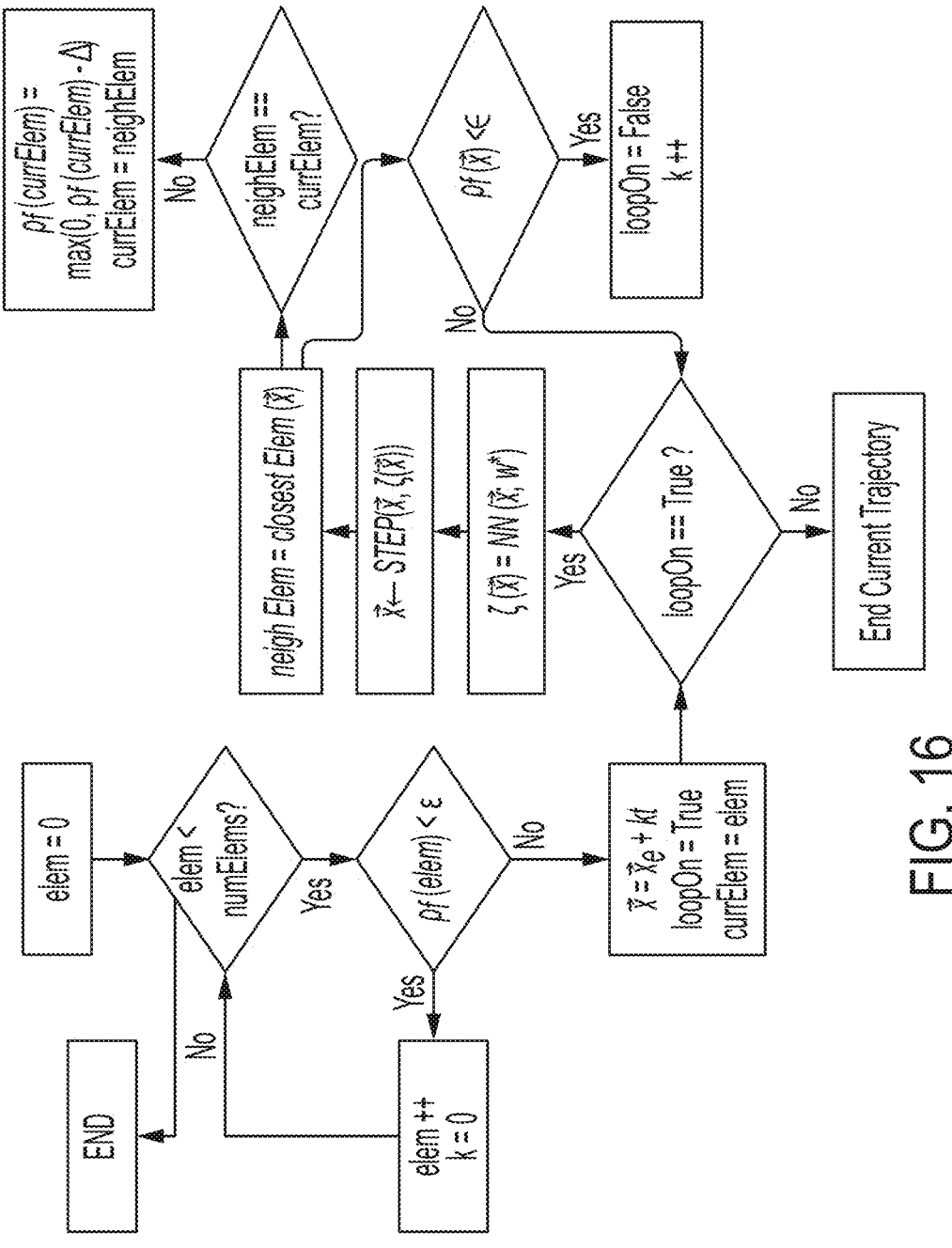
FIG. 16 is a flow diagram showing a post-processing according to an example embodiment.
Figure 17:
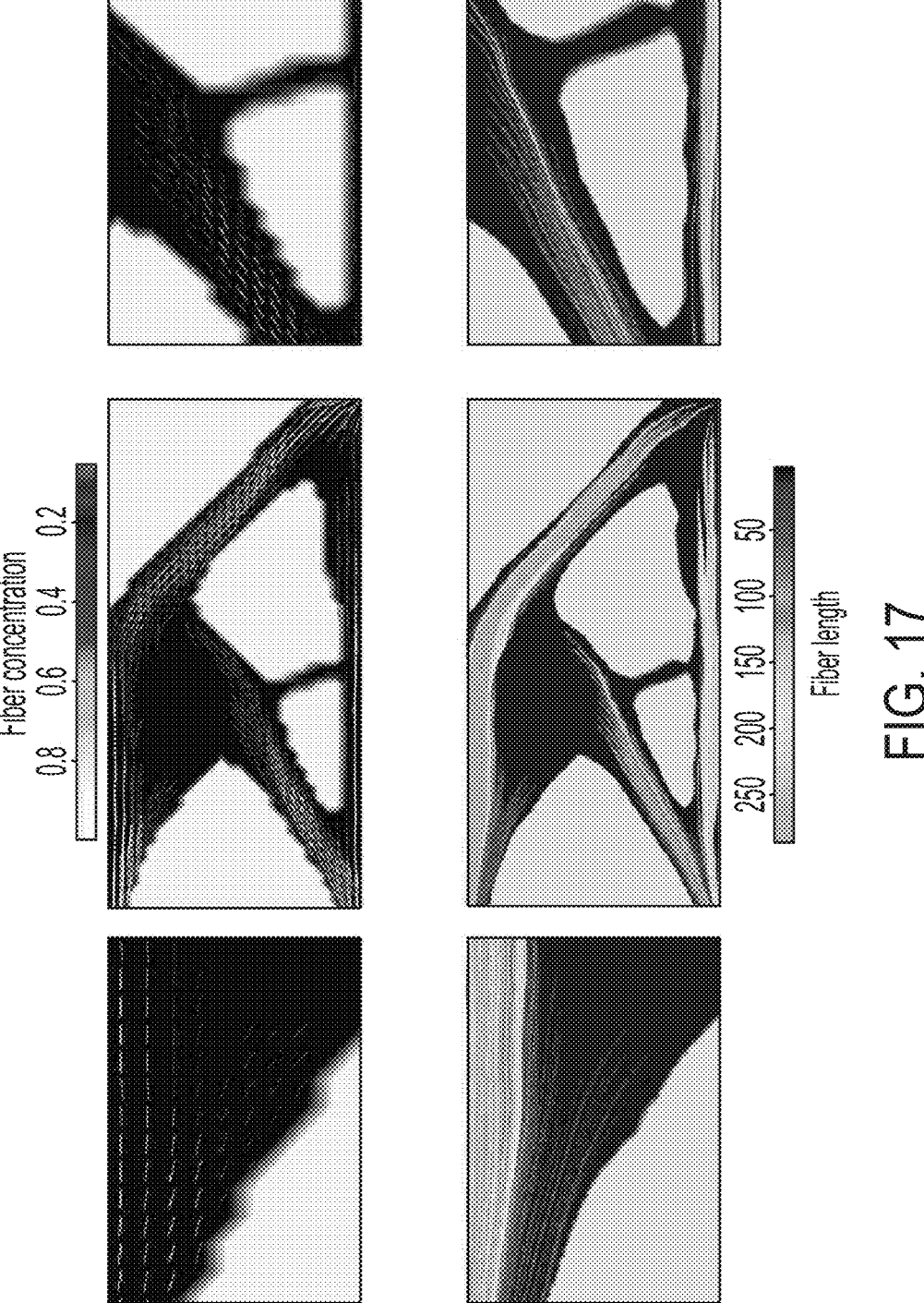
FIGS. 17 and 18 are plots of a design solution using post-processing described in FIG. 16.

Once the optimization is completed, due to the global representation of the topology, one can extract from the neural network a definition of smooth, long, optimally oriented and concentrated fibers. Specifically, the optimized weights allow querying the topology at any location $\zeta(\vec{x}) = NN(\vec{x}; w^*)$, e.g., a scale that is order of magnitudes smaller than the FEA mesh sizes. Then by finely stepping along the paths, one may obtain the desired geometry (e.g., paths and lengths of individual fibers). The post processing algorithm is described in detail in FIG. 16. An optimized design is shown in FIG. 17, with fiber concentration and orientation, and the obtained continuous fibers via the described post processing.

Figure 18:
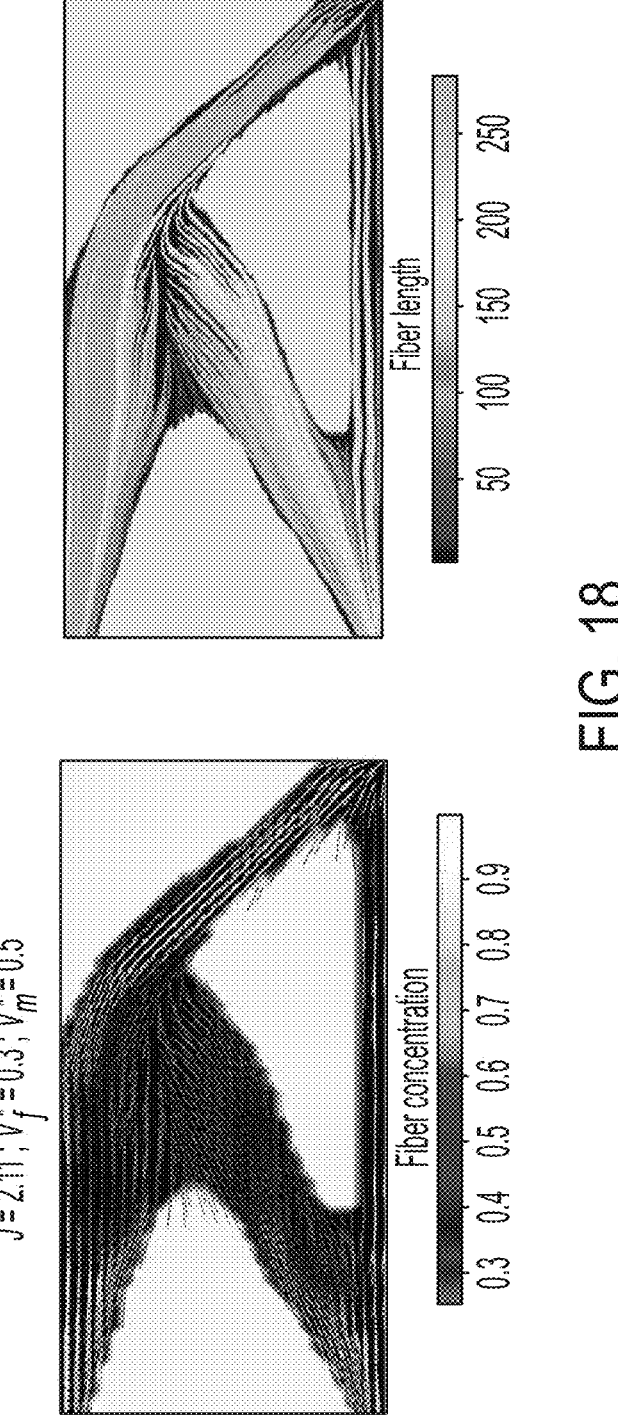

By allowing for variable fiber concentration, that the optimization primarily results in designs with few regions of concentrated fiber, few regions with partially concentrated fibers and regions with no fibers. However, from a manufacturing perspective, it might be of interest to have regions where fibers are present everywhere in the matrix. This filling allows expressing the toolpath in the entirety of the domain. To obtain such a distribution, a minimum (and optionally a maximum) fiber concentration is enforced. The output of the fiber concentration neuron is activated as, $$\rho_f(x) = \rho_f{}^{min}(\rho_f{}^{max} - \rho_f{}^{min})\sigma(op) \tag{14}$$

Where "op" is the pre-activated output of the neuron and $\sigma(\cdot)$ is the sigmoid activation function. This results in $\rho_f \in (\rho_f{}^{max}, \rho_f{}^{min})$. For instance, consider the tip cantilever beam with $V^*_f = 0:6$, $V^*_m = 0:5$ and additionally $\rho_f{}^{min} = 0.2$ and $\rho_f{}^{max} = 1$. The obtained topology and compliance is shown in FIG. 18. The additional constraint on the concentration leads to a minor drop in performance (from J=2.06 to J=2.11) displacement at stipulated nodes.

13

Figure 19:
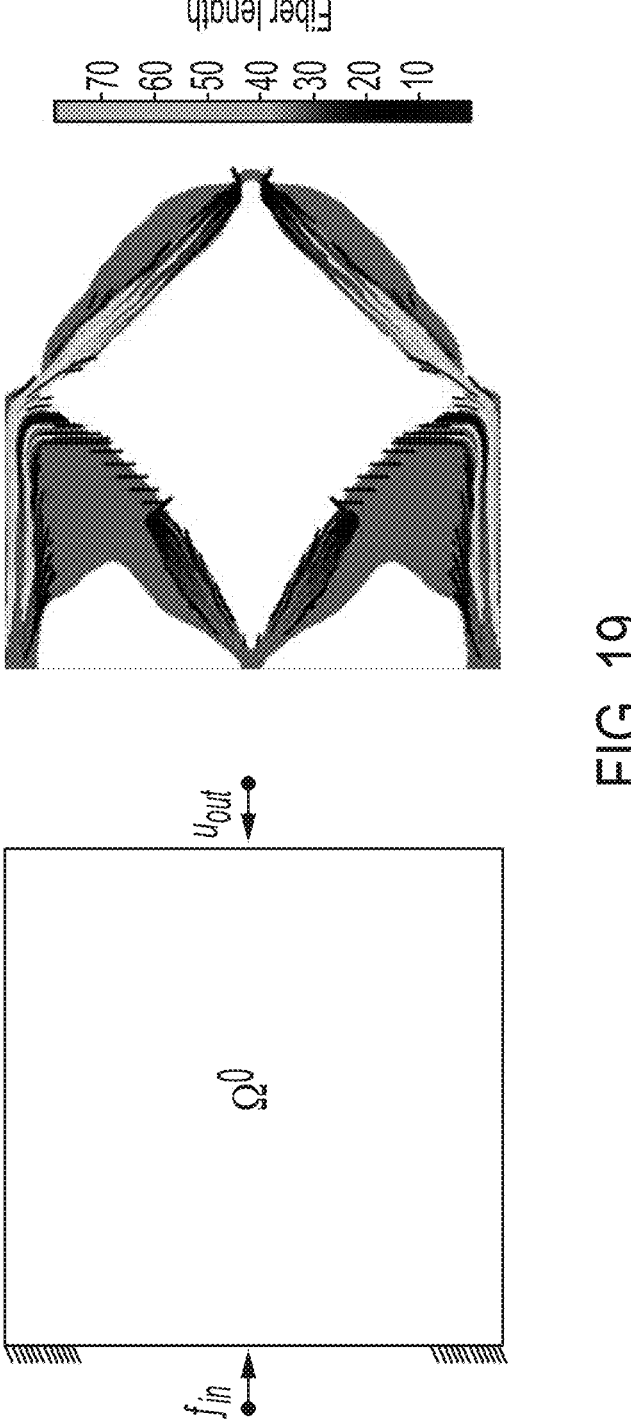
FIG. 19 is a diagram showing optimization of compliant mechanisms according to another example embodiment.
Figure 20:
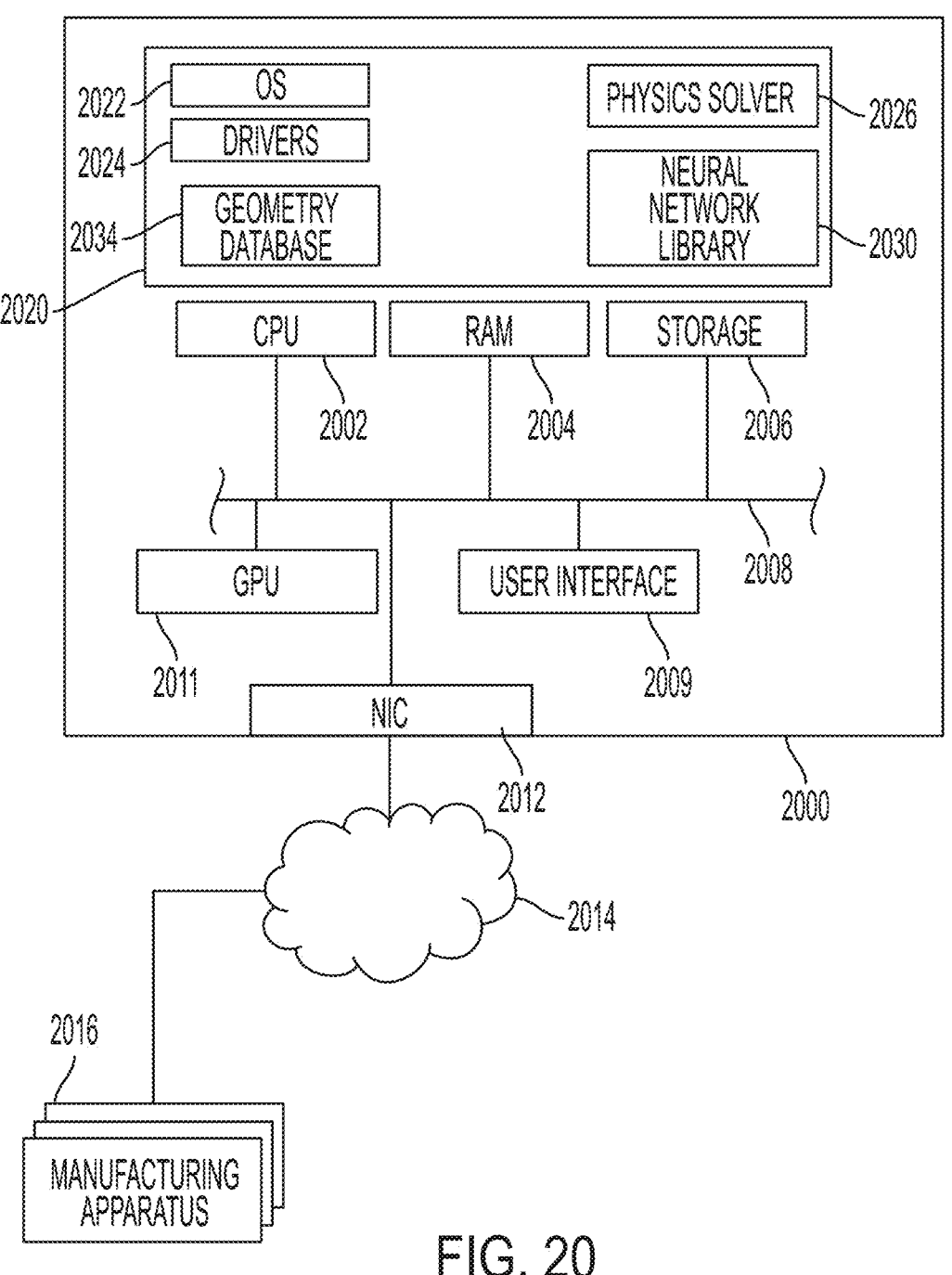
FIG. 20 is a block diagram of a system and apparatus according to an example embodiment.

While TO allows deriving designs in an automated fashion for specified requirements, a factor during design stages is experimenting with the optimization objectives and constraints themselves. Current trends involve error-prone derivation and laborious implementation of the objectives and their sensitivities. In this work, by expressing computations completely using the PyTorch, an end-end differentiable framework. To illustrate, consider the optimization of compliant mechanisms as shown in the diagram of FIG. 19. Here, given input force $f_{in}$, we are interested in maximizing the output displacement as stipulated nodes. By using automatic differentiation, one may change the objective in Equation (6a) as shown in Equation (15). The setup and the design obtained with $V^*_m=0.3$ and $r^*_m=0.3$ is illustrated in FIG. 20.

$$\min_{w} J = -u_{out} \tag{15}$$

The methods and processes described above can be implemented on computer hardware, e.g., workstations, servers, as known in the art. In FIG. 20, a block diagram shows a system and computing apparatus 2000 that may be used to implement methods according to an example embodiment. The apparatus 2000 includes one or more processors 2002 such as a central processing unit, co-processor, digital signal processor, etc. The processor 2002 is coupled to memory, which may include both random access memory 2004 and persistent storage 2006, via one or more input/output busses 2008. Other general-purpose or special-purpose hardware may be coupled to the bus 2008, such as graphics processing unit (GPU) 2011 and network interface 2012. Note that the functions of the apparatus 2000 described below may be implemented via multiple devices, e.g., via client-server arrangement, clustered computing, cloud computing, etc.

The network interface 2012 facilitates communications via a network 2014, using wired or wireless media, with two or more manufacturing apparatuses 2016 that can perform manufacturing operations. Examples of the manufacturing apparatuses 2016 include 3D printers, selective laser metal sintering machines, computer numeric controlled (CNC) mills, CNC lathes, CNC laser cutters, CNC water cutters, etc. Data may also be transferred to the manufacturing apparatuses 2016 using non-network data transfer interfaces, e.g., via portable data storage drives, point-to-point communication, etc.

The apparatus 2000 includes software 2020 such as an operating system 2022 and drivers 2024 that facilitate communications between user-level programs and the hardware. The software 2020 includes a physics solver 2026 that facilitates modeling performance of a part that is optimized via the use of a neural network library 2030. In other words, the physics solver 2026 operates within an NN framework provided by the neural network library 2030. The physics solver 2026 may interface with a geometry database 2034 that includes the part geometry and other factors (e.g., build tolerances, materials, etc.) The physics solver 2026 may perform FEA, finite difference analysis, computational fluid dynamics, etc. The neural network library 2030 may use custom code or existing libraries such as PyTorch, Tensor-Flow, etc. The software 2020 interacts with a user interface 2009 that allows user to, among other things, input design domain and solution parameters, and view the solution results. Note that the functional components shown in FIG. 20 may be distributed among multiple computing apparatuses that communicate via a network or the like.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The various embodiments described above may be implemented using circuitry, firmware, and/or software modules that interact to provide particular results. One of skill in the arts can readily implement such described functionality, either at a modular level or as a whole, using knowledge generally known in the art. For example, the flowcharts and control diagrams illustrated herein may be used to create computer-readable instructions/code for execution by a processor. Such instructions may be stored on a non-transitory computer-readable medium and transferred to the processor for execution as is known in the art. The structures and procedures shown above are only a representative example of embodiments that can be used to provide the functions described hereinabove.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

The invention claimed is:

1. A method comprising:

defining a design domain for a structure, the structure formed of a composite material comprising anisotropic elements embedded in a matrix material, the design domain comprising inputs to the structure and constraints on the structure;

forming a neural network that accepts a coordinate for each location within the design domain and outputs a local composition for each location, the local composition comprising: a density of the matrix material; an orientation of the anisotropic elements; and a concentration of the anisotropic elements;

forming a model of the design domain in a physics solver, the model comprising a plurality of discrete elements that encompass the design domain, a solution of the model providing a value of a design objective;

for each iteration of a plurality of iterations:

determining, from the neural network, current local compositions for the locations in the design domain corresponding to each of the discrete elements;

inputting the current local compositions into the discrete elements of the physics solver to obtain a current value of the design objective;

using the current value of the design objective to find a gradient of a loss function, the gradient used as a sensitivity value to update the neural network; and after completion of the iterations, using the updated neural network to define a topology of the structure.

2. The method of claim 1, wherein the gradient of the loss function is found through automatic differentiation via the neural network.

3. The method of claim 1, wherein the design domain comprises a geometric extent, a force constraint, and an input force, and wherein the loss function comprises a compliance.

4. The method of claim 1, wherein the current local compositions are determined for geometric centers of the discrete elements.

5. The method of claim 1, wherein the anisotropic elements comprise fibers.

6. The method of claim 1, wherein the matrix material is modeled as an isotropic material.

7. The method of claim 1, wherein the physics solver comprises a finite element analysis solver.

8. The method of claim 1, wherein the densities of the matrix material and the concentrations of the anisotropic elements are represented as continuous fields [0,1], wherein a solid isotropic material with penalization function is used that drives the density of the matrix density towards $\{0; 1\}$, and wherein the concentration of the anisotropic elements are un-penalized.

9. The method of claim 1, further comprising transforming the coordinates within the design domain into a frequency space to obtain frequency domain features, the frequency domain features being input into the neural network to obtain the local composition for each location.

10. The method of claim 1, wherein the neural network has first and second forked layers that separate from an intermediate hidden layer, one of the forked layers being trained on the density of the matrix material and the concentration of the anisotropic elements, the second forked layer being trained to optimize the orientation of the anisotropic elements.

11. The method of claim 1, further comprising, after completion of the iterations, performing a post-processing comprising querying the neural network at a scale that is an order of magnitude smaller than the discrete elements of the model to determine paths and lengths of the anisotropic elements.

12. An apparatus comprising a processor coupled to a memory storing instructions, the processor operable via the instructions to perform the method of claim 1.

13. A system, comprising:

a computer-implemented physics solver that operates within a neural network framework;

a computer user interface that facilitates defining a design domain for a structure, the structure formed of a composite material comprising anisotropic elements embedded in a matrix material, the design domain comprising inputs to the structure and constraints on the structure; and wherein the physics solver is configured to:

form a neural network that accepts a coordinate for each location within the design domain and outputs a local composition for each location, the local composition comprising: a density of the matrix material; an orientation of the anisotropic elements; and a concentration of the anisotropic elements;

form a model of the design domain comprising a plurality of discrete elements that encompass the design domain, a solution of the model providing a value of a design objective;

for each iteration of a plurality of iterations:

determine, from the neural network, current local compositions for the locations in the design domain corresponding to each of the discrete elements;

input the current local compositions into the discrete elements of the physics solver to obtain a current value of the design objective;

use the current value of the design objective to find a gradient of a loss function, the gradient as a sensitivity value used to update the neural network; and after completion of the iterations, use the updated neural network to define a topology of the structure.

14. The system of claim 13, wherein the gradient of the loss function is found through automatic differentiation via the neural network.

15. The system of claim 13, wherein the anisotropic elements comprise fibers.

16. The system of claim 13, wherein the physics solver comprises a finite element analysis solver.

17. The system of claim 13, wherein the densities of the matrix material and the concentrations of the anisotropic elements are represented as continuous fields [0,1].

18. The system of claim 13, further comprising transforming the coordinates within the design domain into a frequency space to obtain frequency domain features, the frequency domain features being input into the neural network to obtain the local composition for each location.

19. The system of claim 13, wherein the neural network has first and second forked layers that separate from an intermediate hidden layer, one of the forked layers being trained on the density of the matrix material and the concentration of the anisotropic elements, the second forked layer being trained to optimize the orientation of the anisotropic elements.

20. The system of claim 13, further comprising, after completion of the iterations, performing a post-processing comprising querying the neural network at a scale that is an order of magnitude smaller than the discrete elements of the model to determine paths and lengths of the anisotropic elements.

* * * * *